(12) United States Patent
Kikuchi et al.

(10) Patent No.: US 8,536,691 B2
(45) Date of Patent: Sep. 17, 2013

(54) SEMICONDUCTOR DEVICE AND METHOD FOR MANUFACTURING THE SAME

(75) Inventors: Katsumi Kikuchi, Minato-ku (JP); Shintaro Yamamichi, Minato-ku (JP); Hideya Murai, Minato-ku (JP); Katsumi Maeda, Minato-ku (JP); Takuo Funaya, Minato-ku (JP); Kentaro Mori, Minato-ku (JP); Takehiko Maeda, Kawasaki (JP); Masaya Kawano, Kawasaki (JP); Yuuji Kayashima, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 771 days.

(21) Appl. No.: 12/446,899

(22) PCT Filed: Oct. 9, 2007

(86) PCT No.: PCT/JP2007/069672
§ 371 (c)(1),
(2), (4) Date: May 21, 2009

(87) PCT Pub. No.: WO2008/056499
PCT Pub. Date: May 15, 2008

(65) Prior Publication Data
US 2009/0283895 A1   Nov. 19, 2009

(30) Foreign Application Priority Data
Nov. 6, 2006   (JP) .................................. 2006-300681

(51) Int. Cl.
*H01L 23/02*   (2006.01)

(52) U.S. Cl.
USPC ........... 257/678; 257/690; 257/685; 257/687; 257/711

(58) Field of Classification Search
USPC .......................... 257/678, 690, 685, 687, 711
See application file for complete search history.

(56) References Cited

U.S. PATENT DOCUMENTS

| | | | |
|---|---|---|---|
| 2004/0154163 A1 | 8/2004 | Miyazaki et al. | |
| 2006/0115931 A1* | 6/2006 | Hsu ................. | 438/121 |
| 2006/0145328 A1* | 7/2006 | Hsu ................. | 257/690 |
| 2006/0186536 A1* | 8/2006 | Hsu ................. | 257/720 |
| 2007/0114647 A1* | 5/2007 | Hsu ................. | 257/679 |

FOREIGN PATENT DOCUMENTS

| | | |
|---|---|---|
| CN | 2613046 Y | 4/2004 |
| JP | 11-017349 A | 1/1999 |
| JP | 2001-015650 A | 1/2001 |
| JP | 2001-144245 A | 5/2001 |
| JP | 2001-185653 A | 7/2001 |
| JP | 2002-016173 A | 1/2002 |
| JP | 2002-246505 A | 8/2002 |

(Continued)

*Primary Examiner* — Jae Lee
(74) *Attorney, Agent, or Firm* — Sughrue Mion, PLLC

(57) ABSTRACT

A semiconductor device including a metal frame having a penetrating opening; a semiconductor chip provided in the opening; an insulating layer provided on the upper surface of the metal frame such that the insulating layer covers the upper surface, which is the circuit-formed surface of the semiconductor chip; an interconnect layer provided only on the upper-surface side of the metal frame with intervention of the insulating material and electrically connected to a circuit of the semiconductor chip; a via conductor provided on the upper surface of said semiconductor chip to electrically connect the circuit of the semiconductor chip and the interconnect layer; and a resin layer provided on the lower surface of the metal frame.

25 Claims, 9 Drawing Sheets

(56) References Cited

FOREIGN PATENT DOCUMENTS

| JP | 2002-246506 A | 8/2002 |
| JP | 2004-241660 A | 8/2004 |
| JP | 2004-335641 A | 11/2004 |
| JP | 2005-311249 A | 11/2005 |

* cited by examiner

SEMICONDUCTOR DEVICE AND METHOD FOR MANUFACTURING THE SAME

TECHNICAL FIELD

The present invention relates to a semiconductor device containing a semiconductor chip and a method for manufacturing the semiconductor device.

BACKGROUND ART

In recent years, there has been a rapid progress in the downsizing, thinning and densification of electronic apparatus, such as portable devices. In addition, the number of terminals has been increased due to speeding up and functional upgrading of semiconductor devices. Consequently, there is a demand for the thinning, miniaturization and densification of packages equipped with semiconductor chips.

Conventionally, a substrate including through-holes, such as a build-up substrate, has been generally known as a wiring substrate. It is difficult to thin, miniaturize and densify the substrate, however, since the substrate is thick and the through-hole pitch thereof is large. In addition, the presence of through-holes makes the substrate unsuitable for high-speed signal transmission.

Although a thin substrate, such as a tape substrate, is also used concurrently, the substrate is limited to a single or two interconnect layers due to the manufacturing method of the substrate. In addition, the base material of a tape expands and contracts significantly, and hence the positional accuracy of patterns is inferior to that of a build-up substrate. Thus, it is difficult to densify the tape substrate.

When mounting semiconductor chips, flip-chip interconnection using solder balls, wire-bonding interconnection using gold wires, or the like is used. It is difficult, however, to narrow a pitch in either case of these interconnection methods.

In the flip-chip interconnection, a semiconductor chip and a wiring substrate are interconnected through bumps formed using microscopic solder balls or the like. However, as the number of terminals of the semiconductor chip increases or the pitch thereof becomes narrower, it is increasingly difficult to achieve bump-based interconnection. In addition, since the strength of the bumps themselves decreases, connection points are liable to break down. Furthermore, an electric resistance value increases at a connecting part. Consequently, voids due to the migration of metal atoms dependent on an electric current direction tend to occur and, therefore, a connection failure is likely to occur.

In the wire bonding interconnection, a wire, as typified by a gold wire, becomes liable to break if the diameter thereof is decreased in order to narrow a pitch. In addition, the margin of connection conditions decreases, thus making it difficult to achieve stable interconnection.

As an example of the above-described flip-chip interconnection, patent document 1 (Japanese Patent Laid-Open No. 2001-185653) discloses a semiconductor device in which a frame having an opening in the center thereof and made of metal or the like is provided on a multilayer organic insulated substrate including an interconnect layer and a via, and a semiconductor chip is mounted in the opening using bumps. In addition, patent document 2 (Japanese Patent Laid-Open No. 2001-144245) discloses a semiconductor package in which a frame-like metal plate having an opening is provided on a multilayer resin wiring substrate and a semiconductor chip is mounted in the opening using bumps.

As a packaging technique capable of densification, there has been recently proposed a technique of forming a multilayer interconnect structure directly onto a semiconductor chip according to a design rule adapted to the connection pitch of the semiconductor chip.

Patent document 3 (Japanese Patent Laid-Open No. 2002-16173) discloses a semiconductor device including a substrate having a concave portion and composed of a bottom plate and a resin frame material, a semiconductor chip mounted within this concave portion, and a multilayer interconnect structure including an organic insulating layer, a metal via and an interconnect layer and provided so as to cover this semiconductor chip and a surface of the substrate.

Patent document 4 (Japanese Patent Laid-Open No. 2002-246506) discloses a multilayer printed-wiring board including a resin substrate having a concave portion, an IC chip mounted within this concave portion, and a multilayer interconnect structure provided so as to cover this IC chip and a surface of the substrate. The patent document also discloses a multilayer printed-wiring board in which a substrate is composed of a plate-like heat sink and a resin layer having a penetrating opening, an IC chip is mounted in the opening of this substrate, and a multilayer interconnect structure is provided thereon.

Patent document 5 (Japanese Patent Laid-Open No. 2004-335641) discloses a method for manufacturing a substrate containing semiconductor elements, including: bonding a semiconductor chip to a first sheet; preparing a second sheet having an opening and composed of a insulating resin and placing the second sheet so that the semiconductor chip is housed in the opening; laminating a third sheet composed of a resin layer and a conductive layer with the resin layer positioned underneath the conductive layer; collectively thermocompression-bonding the first, second and third sheets; electrically connecting the electrode portion of the semiconductor chip and the conductive layer of third sheet to each other; and pattern-processing the conductive layer of the third sheet to form an interconnect.

Patent document 6 (Japanese Patent Laid-Open No. 2005-311249) discloses a parts-containing multilayer substrate including: a core layer in which a metal layer is laminated through a resin layer and openings having different heights are formed; electronic components mounted within the openings of this core layer; and an interconnect structure formed on both surfaces of the core layer.

DISCLOSURE OF THE INVENTION

However, the above-described related arts have the below-described problems.

In the techniques described in patent documents 1 and 2, it is difficult to mount a semiconductor chip having a narrow terminal pitch, as described above. In addition, it is difficult to provide a high-yield, high-reliability, high-density semiconductor device since connecting parts are liable to break down.

In the techniques described in patent documents 3, 4 and 5, a resin is used for the frame material located around the semiconductor chip. In such a structure as described above, if an interconnect structure containing a resin insulating layer is provided on only one side surface for thinning purposes in particular, warpage is liable to occur due to a difference in the contraction percentage of a resin material. If warpage takes place, defects tend to occur in connecting parts between the semiconductor chip and an interconnect. In addition, it becomes difficult to mount this semiconductor chip-equipped substrate onto another substrate. Furthermore, a stress arises in the semiconductor chip, thus possibly causing a degradation in device characteristics. If the frame material or the substrate having a concave portion is thickened or a reinforcing plate is provided in an attempt to suppress such warpage, it becomes difficult to thin down the semiconductor device.

In addition to such a warpage problem as described above, the structure having the frame material made of resin has the problem of poor heat radiation characteristics since the semiconductor chip, which is a source of heat generation, is surrounded by a resin composing the multilayer interconnect structure and a resin composing the frame material.

The technique described in patent document 6 is intended to build electronic components different in size (height) into the substrate, and accordingly the core layer for accommodating electronic components is formed into a laminated structure composed of a resin layer and a plurality of metal layers. Thus, the technique is not intended to achieve thinning. In addition, the technique has the problem that the number of manufacturing steps increases since a lamination process is required in forming the core layer.

An object of the present invention is to provide a high-density, thin semiconductor device superior in device characteristics and reliability, and a simplified method for manufacturing the semiconductor device.

According to the present invention, there is provided the below-described semiconductor device and a method for manufacturing the semiconductor device.

(1) A semiconductor device including:
a metal frame including a penetrating opening;
a semiconductor chip provided within the opening;
an insulating layer provided on the upper surface of the metal frame such that the insulating layer covers the upper surface of the semiconductor chip, the upper surface being a circuit-formed surface thereof;
an interconnect layer provided only on the upper-surface side of the metal frame with intervention of the insulating material of the insulating layer, the interconnect layer being electrically connected to a circuit of the semiconductor chip;
a via conductor provided on the upper surface of the semiconductor chip to electrically connect the circuit of the semiconductor chip and the interconnect layer to each other; and
a resin layer provided on the lower surface of the metal frame.

(2) The semiconductor device according to item (1), further including a metal pattern made of a metal filling an opening penetrating the resin layer, wherein the metal pattern is provided at least in a region immediately underneath the lower surface of the semiconductor chip.

(3) The semiconductor device according to item (2), wherein the resin layer extends from the lower surface of the metal frame to a region immediately underneath the lower surface of the semiconductor chip, and the metal pattern is provided only in the region immediately underneath the lower surface of the semiconductor chip.

(4) The semiconductor device according to item (2), wherein the metal pattern has a pattern portion extending from the region immediately underneath the lower surface of the semiconductor chip onto the lower surface of the metal frame.

(5) The semiconductor device according to item (4), wherein the resin layer extends from the lower surface of the metal frame to the region immediately underneath the lower surface of the semiconductor chip, and the metal pattern includes a pattern portion provided within the region immediately underneath the lower surface of the semiconductor chip, and a linear pattern portion connected to the pattern portion and extending onto the lower surface of the metal frame.

(6) The semiconductor device according to item (4), wherein the metal pattern covers the whole of the region immediately underneath the lower surface of the semiconductor chip and a peripheral region surrounding the semiconductor chip in the lower surface of the metal frame.

(7) The semiconductor device according to any one of items (1) to (5), wherein the resin layer is provided in a region immediately underneath the lower surface of the metal frame and the lower surface of the semiconductor chip, and the semiconductor device includes an adhesion layer provided between the semiconductor chip and the resin layer to bond the semiconductor chip and the resin layer to each other.

(8) The semiconductor device according to any one of items (1) to (7), including a filling layer made of an insulating material filled in a gap between a side surface of the semiconductor chip and a side surface within the opening of the metal frame.

(9) The semiconductor device according to item (8), wherein the upper surface of the filling layer, the upper surface of the semiconductor chip, and the upper surface of the metal frame are flush with one another.

(10) The semiconductor device according to item (8), wherein the upper surface of the filling layer protrudes above the upper surface of the semiconductor chip and the upper surface of the metal frame.

(11) The semiconductor device according to item (8), wherein the upper surface of the filling layer is recessed below the upper surface of the semiconductor chip and the upper surface of the metal frame.

(12) The semiconductor device according to any one of items (1) to (11), further including:
a first electrical conductor provided within the insulating layer and having contact with the upper surface of the semiconductor chip;
a second electrical conductor provided within the insulating layer and having contact with the upper surface of the metal frame; and
a heat-conducting path including an electrical conductor layer located on the insulating layer to connect the first electrical conductor and the second electrical conductor to each other.

(13) The semiconductor device according to item (12), wherein the electrical conductor layer used for the heat-conducting path is made of the same material as the interconnect layer.

(14) The semiconductor device according to any one of items (1) to (13), further including an interconnect layer electrically connected to the metal frame.

(15) The semiconductor device according to item (14), wherein the metal frame is electrically connected to a power line or a ground line through the interconnect layer.

(16) The semiconductor device according to any one of items (1) to (15), wherein the upper surface of the semiconductor chip and the upper surface of the metal frame are flush with each other.

(17) The semiconductor device according to any one of items (1) to (15), wherein the upper surface of the semiconductor chip protrudes above the upper surface of the metal frame.

(18) The semiconductor device according to any one of items (1) to (15), wherein the upper surface of the semiconductor chip is recessed below the upper surface of the metal frame.

(19) The semiconductor device according to any one of items (1) to (18), including one or a plurality of interconnect structure layers including:

an upper-layer side insulating layer provided on the upper-surface side of the insulating layer;

a via conductor provided in the upper-layer side insulating layer; and an interconnect layer provided on the upper surface of the upper-layer side insulating layer and electrically connected to a lower interconnect layer through the via conductor; and wherein the semiconductor device further includes:

an uppermost insulating layer composing an uppermost layer;

a via conductor provided in the uppermost insulating layer; and an external terminal provided on the upper surface of the uppermost insulating layer and electrically connected to a lower interconnect layer through the via conductor.

(20) A method for manufacturing a semiconductor device as recited in item (1), including:

forming a resin layer on one surface of a metal base material;

obtaining a metal frame by forming an opening in the metal base material from the other surface side thereof such that the resin layer is expose;

mounting a semiconductor chip within the opening with the circuit-formed surface of the semiconductor chip facing up;

forming an insulating layer covering the metal frame and the semiconductor chip;

forming a via conductor connected to a conductive portion of the upper surface of the semiconductor chip; and forming an interconnect layer electrically connected to the via conductor.

(21) A method for manufacturing a semiconductor device as recited in item (2), including:

forming a metal pattern on one surface of a metal base material;

forming a resin layer covering the metal pattern;

obtaining a metal frame by forming an opening in the metal base material from the other surface side thereof such that the metal pattern remains;

mounting a semiconductor chip within the opening with the circuit-formed surface of the semiconductor chip facing up;

forming an insulating layer covering the metal frame and the semiconductor chip;

forming a via conductor connected to the conductive portion of the upper surface of the semiconductor chip;

forming an interconnect layer electrically connected to the via conductor; and removing the resin layer such that the metal pattern is exposed.

(22) A method for manufacturing a semiconductor device as recited in item (1), including:

bonding a supporting substrate and a metal base material to each other with intervention of a resin layer;

obtaining a metal frame by forming an opening in the metal base material such that the resin layer is exposed;

mounting a semiconductor chip within the opening with the circuit-formed surface of the semiconductor chip facing up;

forming an insulating layer so as to cover the metal frame and the semiconductor chip;

forming a via conductor to be connected to a conductive portion of the upper surface of the semiconductor chip;

forming an interconnect layer to be electrically connected to the via conductor; and separating the resin layer and the supporting substrate from each other.

(23) A method for manufacturing a semiconductor device as recited in item (1), including:

forming a resin layer and a metal frame including an opening on a supporting substrate;

mounting a semiconductor chip within the opening of the metal frame with the circuit-formed surface of the semiconductor chip facing up;

forming an insulating layer covering the metal frame and the semiconductor chip;

forming a via conductor connected to the conductive portion of the upper surface of the semiconductor chip;

forming an interconnect layer electrically connected to the via conductor; and separating the resin layer and the supporting substrate from each other.

(24) The method for manufacturing a semiconductor device according to item (22) or (23), including providing a separation layer on the supporting substrate or on the resin layer, so that the supporting substrate is bonded to the resin layer through the separation layer.

(25) The method for manufacturing a semiconductor device according to any one of items (20) to (24), wherein the semiconductor chip is mounted with intervention of an adhesion layer in mounting the semiconductor chip.

(26) The method for manufacturing a semiconductor device according to any one of items (20) to (25), including filling an insulating material in a gap between a side surface of the semiconductor chip mounted within the opening and a side surface within the opening of the metal frame.

According to the present invention, it is possible to provide a high-density, thin semiconductor device superior in device characteristics and reliability, and a simplified method for manufacturing the semiconductor device.

BEST MODE FOR CARRYING OUT THE INVENTION

Hereinafter, exemplary embodiments of the present invention will be described with reference to the accompanying drawings.

First Exemplary Embodiment

Figure 1:
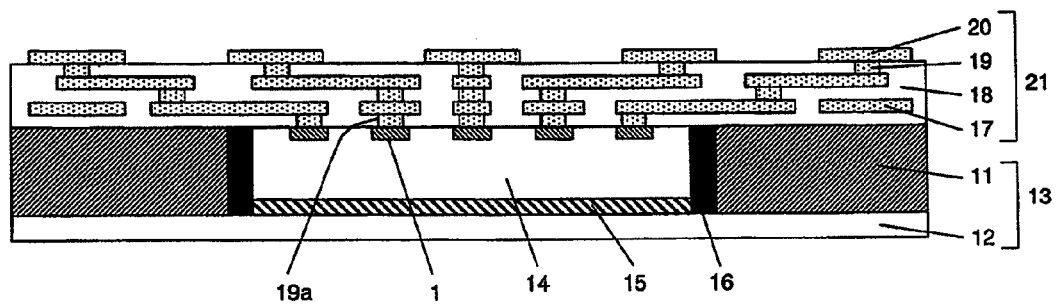
FIG. 1 is a schematic cross-sectional view illustrating one example of a first exemplary embodiment of a semiconductor device of the present invention.

FIG. 1 is a schematic cross-sectional view illustrating one example of the configuration of a semiconductor device of the present invention. In the configuration shown in FIG. 1, a semiconductor chip 14 is mounted within the concave portion of a base material 13 composed of a metal frame 11 and a resin layer 12 through an adhesion layer 15. An insulating material is filled in a trench between this semiconductor chip 14 and the metal frame 11 and, thus, a filling layer 16 is formed. In addition, an interconnect structure 21 is provided on the base material 13 in which the semiconductor chip 14 is mounted.

In this interconnect structure 21, an interconnect layer 17 is formed with intervention of an insulating layer 18, and an upper-layer side interconnect and a lower-layer side interconnect are electrically connected to each other through a via. An external terminal 1 of the semiconductor chip is electrically connected to the upper-layer side interconnect layer 17 through a via 19a. An external terminal 20 is provided on the uppermost surface of the interconnect structure 21. This external terminal 20 is electrically connected to the semiconductor chip 14 through a via 19 and the interconnect layer 17 that are provided within the insulating layer 18.

In this configuration, the frame 11 making up the periphery of the semiconductor chip 14 is composed only of a metal superior in rigidity to a resin. In addition, the resin layer provided on the lower-surface side of the metal frame is capable of alleviating a stress due to the contraction of the insulating layer 18 provided on the upper-surface side of the metal frame. This suppresses the warpage and undulation of a semiconductor device in a process of manufacture or after the completion of manufacture. Since the warpage and undulation can be suppressed in a manufacturing process, it is possible to precisely form an interconnect layer and a via to be provided in the insulating layer. In addition, reliability can be improved since it is possible to suppress the warpage and undulation of a finished semiconductor device. It is also possible to precisely mount the semiconductor device onto another substrate or the like. As a result, it is possible to thin down the semiconductor device.

In addition, since the frame 11 is composed of a metal, it is possible to improve heat radiation performance, thereby stabilizing the operation of elements.

Furthermore, the semiconductor device has a structure in which the conductive portion (external terminal 1) of the semiconductor chip 14 and the via 19a are directly connected to each other without using any connecting material, such as solder, thereby electrically connecting the semiconductor chip 14 to the interconnect layer 17. Consequently, it is possible to easily mount a semiconductor chip having a narrow-terminal pitch, high-density circuit. In addition, it is possible to suppress a connection resistance and prevent connection failure.

Examples of a metal for making up the metal frame 11 include copper, nickel, aluminum, gold, silver, palladium, platinum, iron, stainless steel, zinc, magnesium, titanium, 42-alloy, chromium, vanadium, rhodium, molybdenum, and cobalt. One metal alone or a plurality of materials selected from these metals may be used, and the metal frame may have a single-layer structure or a laminated structure composed of a plurality of metals, as necessary. Copper or a copper alloy, among these metals, is preferred from the viewpoint of costs, processability, and the like. If there is a concern about metal contamination that may cause a performance degradation in semiconductor elements, a material having barrier properties, such as nickel, can be used. Alternatively, a covering layer made of such a material having barrier properties may be provided.

Figure 2:
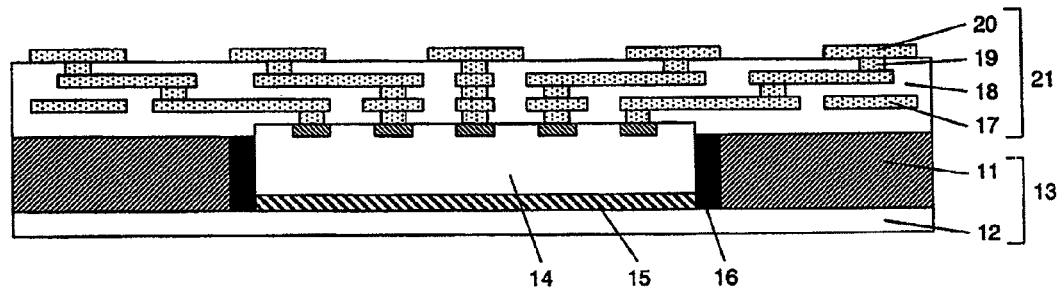
FIG. 2 is a schematic cross-sectional view illustrating another example of the first exemplary embodiment of the semiconductor device of the present invention.
Figure 3:
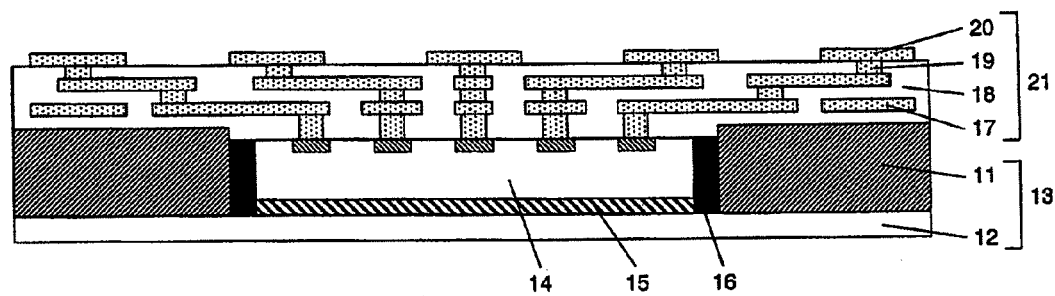
FIG. 3 is a schematic cross-sectional view illustrating yet another example of the first exemplary embodiment of the semiconductor device of the present invention.

The thickness of the metal frame 11 may be selected as appropriate, according to the thickness of the semiconductor chip 14 to be mounted. If the circuit-formed surface (upper surface) of the semiconductor chip 14 and the upper surface of the metal frame 11 are almost level with each other, as shown in FIG. 1, stability at the time of providing the interconnect structure 21 improves, thus making it easy to form microscopic connections and interconnects. If the upper surface of the semiconductor chip 14 protrudes above the upper surface of the metal frame 11, as shown in FIG. 2, it is possible to form microscopic electrical connections, thereby meeting a requirement for the narrowing down of pitches. In addition, there is no interference of a tool used when mounting the semiconductor chip 14 in the base material 13, with the metal frame 11. Thus, it is possible to improve mounting accuracy. If the upper surface of the semiconductor chip 14 is recessed below the upper surface of the metal frame 11, as shown in FIG. 3, it is easy to prevent chipping or separation in edges of the semiconductor chip 14.

The metal frame 11 can be obtained by providing an organic resin layer 12 on a metal plate, and then forming an opening by etching.

In the present example, a 110 μm-thick semiconductor chip 14 was mounted in the opening of the metal frame 11 made of a 125 μm-thick film of copper with intervention of a 15 μm-thick adhesion layer 15.

The organic resin layer 12 provided on the lower-surface side of the metal frame can be formed using, for example, a photosensitive or nonphotosensitive organic material. As the organic material, it is possible to use, for example, an epoxy resin, an epoxy acrylate resin, an urethane acrylate resin, a polyester resin, a phenol resin, a polyimide resin, BCB (benzocyclobutene), PBO (polybenzoxazole), a polynorbornene resin, or a material made by impregnating a woven fabric or an unwoven fabric formed of glass cloth or aramid fiber with any of these resins. In particular, a polyimide resin, PBO, or a material made by impregnating a woven fabric or an unwoven fabric with a resin is preferred since these materials are superior in mechanical characteristics, such as film strength, a modulus of elongation and a percentage of elongation at break and, therefore, high reliability can be attained.

Although in FIG. 1, the organic resin layer 12 is provided so as to cover the whole of the lower surface of the metal frame 11, the present exemplary embodiment is not limited to this. Alternatively, the lower surface of the metal frame 11 may not be entirely covered, according to a desired effect. In the present example, a 10 μm-thick polyimide resin was used and the organic resin layer was provided so as to be the same in size as the metal frame 11.

In the present exemplary embodiment, the opposing surface (lower surface) of the semiconductor chip 14 opposite to the circuit-formed surface (upper surface) thereof is bonded to the organic resin layer 12 with intervention of the adhesion layer 15. The semiconductor chip 14 can be thinned before use, as necessary, by grinding the rear surface thereof. In the present example, a 110 μm-thick semiconductor chip 14 was used.

Figure 4:
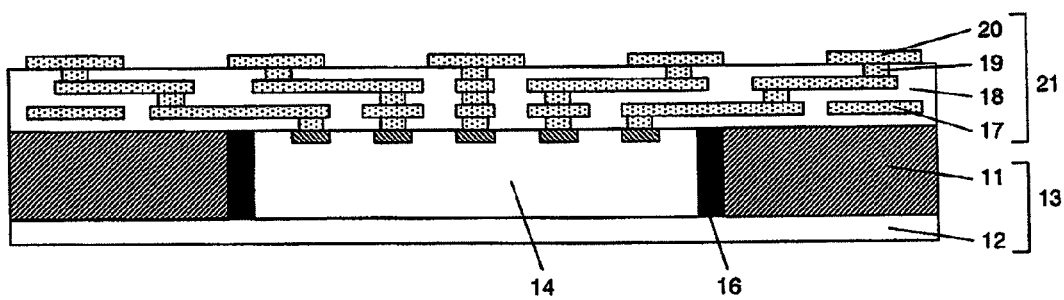
FIG. 4 is a schematic cross-sectional view illustrating still another example of the first exemplary embodiment of the semiconductor device of the present invention.

The adhesion layer 15 is used to bond together the semiconductor chip 14 and the organic resin layer 12. For the adhesion layer, it is possible to use an organic material, such as an epoxy-, polyimide-, acrylic-, urethane-, or epoxy acrylate-based material, or a material containing silver paste or a solder material as a major component. If the organic resin layer 12 itself has bonding capability, the semiconductor chip 14 may be directly bonded onto the organic resin layer 12, as shown in FIG. 4. As the organic resin layer 12 having bonding capability, it is possible to use an organic material having thermoplasticity, or an organic resin in a state of having not yet undergone hardening reaction. In the present example, a 15 μm-thick adhesion layer made of a polyimide-based material was formed.

The filling layer 16 is made of an insulating material filled in a gap present between a side surface of the semiconductor chip 14 and an internal surface of the opening of the metal frame 11. This gap is formed in order to avoid tool interference when mounting the semiconductor chip 14 within the opening of the metal frame 11. As this insulating material, it is possible to use an organic material, such as an epoxy-, polyimide-, acrylic-, urethane-, or epoxy acrylate-based resin, or a material made by adding an inorganic filler, as typified by silica, alumina, titanium oxide and the like, to any of these organic materials. If the gap can be filled with a material used for the insulating layer 18 of the interconnect structure 21, it is possible to form a filling layer using this material.

Figure 5:
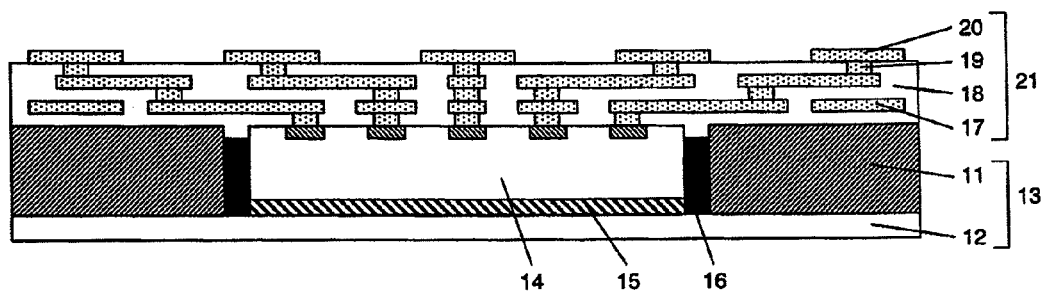
FIG. 5 is a schematic cross-sectional view illustrating still another example of the first exemplary embodiment of the semiconductor device of the present invention.
Figure 6:
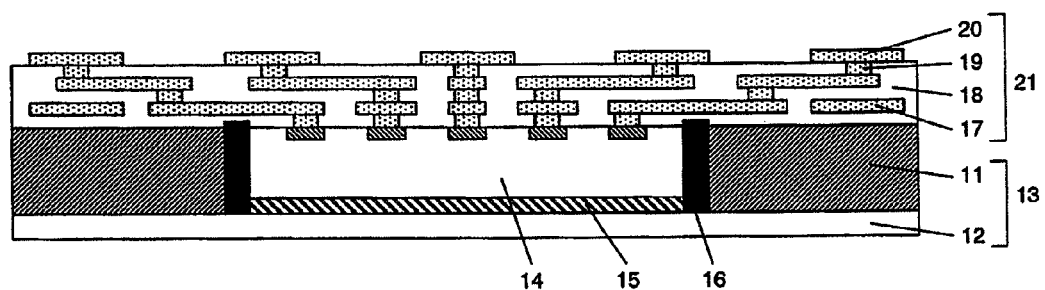
FIG. 6 is a schematic cross-sectional view illustrating still another example of the first exemplary embodiment of the semiconductor device of the present invention.

In FIG. 1, the upper surface of the filling layer 16 is level with the upper surface of the semiconductor chip 14. Alternatively, the upper surface of the filling layer 16 may protrude above the upper surface of the semiconductor chip, as shown in FIG. 6, or may be recessed below the upper surface of the semiconductor chip, as shown in FIG. 5. If the upper surface of the filling layer 16 protrudes, it is possible to protect the edges of the semiconductor chip 14, thereby preventing the chipping or separation of the edges. It is also possible to alleviate a stress applied to the semiconductor chip 14 by the interconnect structure 21, thereby improving reliability. On the other hand, if the upper surface of the filling layer 16 is recessed below the upper surface of the semiconductor chip 14, it becomes easy to control the amount of insulating material to be filled. Thus, it is possible to manufacture a semiconductor device in a stable manner. In the structures shown in FIGS. 2 and 3, it is possible to have a structure in which the upper surface of the filling layer 16 protrudes above the upper surfaces of the semiconductor chip and the metal frame, and the upper surface of the filling layer 16 is recessed below the upper surfaces of the semiconductor chip and the metal frame. In these cases, it is possible to obtain an effect in which the advantages of the respective structures are combined. In the present example, a filler-free epoxy-based organic material was used as the insulating material to form the filling layer, the upper surface of which was located approximately 3 μm lower than the upper surface of the semiconductor chip.

The interconnect structure 21 is composed of an insulating layer, an interconnect layer on the insulating layer, a via provided in the insulating layer, and an external terminal 20 provided on the uppermost surface of the interconnect structure, wherein an interconnect layer 17 and an insulating layer 18 are alternately laminated. The terminal 1 of the semiconductor chip 14 through to the external terminal 20 are electrically connected to one another through a via and an interconnect layer provided within the insulating layer 18. The terminal 1 of the semiconductor chip is directly connected to the via 19a within the insulating layer without going through a bump.

As a material for the interconnect layer 17, there can be mentioned a conductive material, such as copper, gold, nickel, aluminum, silver, palladium, or the like. It is possible to use one of these materials alone or a plurality thereof in combination. From the viewpoint of resistance values and costs, copper or a copper alloy is preferred. In addition, nickel is capable of preventing the interfacial reaction of other materials, such as an insulating material, with an interconnect material. Nickel can also be used as a resistive interconnect or an inductor by taking advantage of the characteristics thereof as a magnetic substance. In the present example, a 10 μm-thick copper interconnect was formed using a later-described semi-additive method (power supply layer was formed using a sputtering method).

For the insulating layer 18, it is possible to use the same material as the organic material of the above-described organic resin layer 12. In particular, a polyimide resin, PBO, or a material made by impregnating a woven fabric or an unwoven fabric with a resin is preferred since these materials are superior in mechanical characteristics, such as film strength, a modulus of elongation and a percentage of elongation at break and, therefore, high reliability can be attained. In the present example, a 10 μm-thick insulating layer made of a polyimide resin was formed between the metal frame and the interconnect layer, between the semiconductor chip and the interconnect layer, between the lower-layer side interconnect layer and the upper-layer side interconnect layer, and between the interconnect layer and the external terminal.

The vias 19 and 19a are provided within the insulating layer 18 to connect the terminal 1 of the semiconductor chip to the interconnect layer, the lower-layer side interconnect layer to the upper-layer side interconnect layer, and the interconnect layer to the external terminal 20. The vias can be formed by forming via holes in the insulating layer and then filling the conductive material in the via holes when forming a conductive film for the formation of the interconnect layer. The vias can also be formed by filling the conductive material in the via holes or by forming the conductive material along the inner wall surfaces of the via holes, separately from the formation of the interconnect layer. As another method, a plated post is previously formed in a position where a via is to be formed, and then an insulating film is formed thereover. Then, the surface of the insulating film is ground by means of polishing, so as to expose the plated post. The via can thus be obtained. According to this plated post method, there is no need to previously form a via hole in the insulating layer. Alternatively, it is possible to apply a structure, in which electrical connections are made wirelessly by means of inductive coupling, capacitive coupling, or the like, as a substitute for vias. Still alternatively, an opening may be formed in the insulating layer to be provided with an interconnect layer, with the insulating layer sloped, and then a direct connection may be made between the upper and lower interconnect layers and between the semiconductor chip and the interconnect layers. Still alternatively, part of connection between the semiconductor chip 14 and the interconnect layers may be made by means of optical coupling. In this case, optical interconnects may be used as the interconnect layers. In the present example, vias made of copper were formed using a plated post method.

The external terminal 20 is provided on the uppermost surface of the interconnect structure and electrically connected to the semiconductor chip 14 through a via and interconnect layers.

The external terminal 20 can be formed of a laminated body in which a plurality of layers is laminated. In consideration of, for example, the wettability of a solder ball provided on the surface of the external terminal 20 or the connectivity with a bonding wire, the surface of the external terminal is preferably formed of at least one type of metal, or an alloy thereof, selected from the group consisting of gold, silver, copper, tin and a solder material.

Although in FIG. 1, any solder resist is not provided on the interconnect structure, a solder resist may be provided thereon, so that at least part of the external terminal 20 is exposed in the interconnect structure. If a solder resist is provided, only the surface of the external terminal 20 within the opening of the solder resist may be formed of at least one type of metal, or an alloy thereof, selected from the group consisting of gold, silver, copper, tin and a solder material.

The external terminal may be formed into a structure in which a pattern of the solder resist is formed, and then the external terminal is provided so as to cover the opening of the resist pattern.

In the present example, a 10 μm-thick copper pattern was formed as the external terminal 20, and then a solder resist (not illustrated) was formed. Then, a 3 μm-thick film of nickel (not illustrated) and a 0.5 μm-thick film of gold (not illustrated) were deposited only on a copper film within the opening of the solder resist, so that the uppermost surface was formed of gold.

As illustrated in the figure, the present exemplary embodiment shows a case in which two interconnect layers and three insulating layers are provided. However, the present exemplary embodiment is not limited to this. The number of interconnect layers and the number of insulating layers can be set as appropriate. In addition, an interconnect layer may be provided on an insulating layer on which the external terminal 20 is provided. This interconnect layer may be formed concurrently with the formation of the external terminal.

According to the structure of the present exemplary embodiment, it is possible to obtain a stable configuration in which warpage and undulation are suppressed. Accordingly, it is possible to densely provide microscopic interconnects and thereby obtain a thin semiconductor device. In addition, since the semiconductor chip is covered with the metal frame, the organic resin layer and the interconnect structure, a stress that occurs when the semiconductor device is mounted on another substrate or the like is not directly applied to the semiconductor chip. Consequently, the reliability of secondary packaging is improved. Furthermore, the semiconductor chip and the interconnect structure are connected to each other without any connecting material such as solder interposed therebetween. Therefore, unlike a condition referred to as primary packaging, it is possible to obtain a stable coupling structure. Since the resistance of the connecting part is small and connection failure is suppressed, it is possible to stabilize a supply of power to semiconductor elements.

Second Exemplary Embodiment

Figure 7:
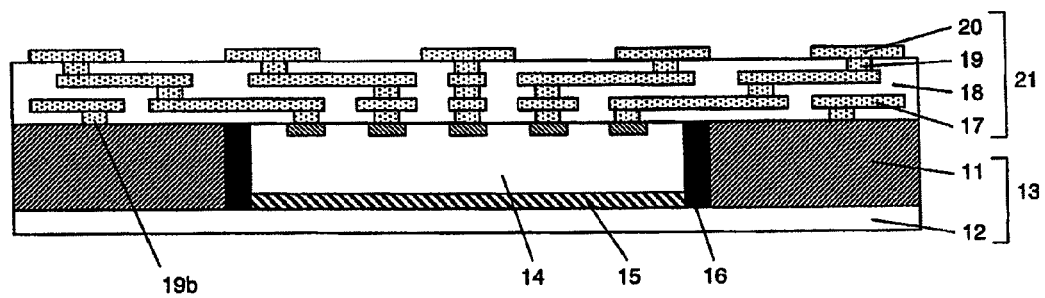
FIG. 7 is a schematic cross-sectional view illustrating one example of a second exemplary embodiment of a semiconductor device of the present invention.

FIG. 7 is a schematic cross-sectional view illustrating another exemplary embodiment of the configuration of a semiconductor device of the present invention. The present exemplary embodiment differs from the first exemplary embodiment in that the metal frame 11 is electrically connected to an interconnect layer of the interconnect structure 21. The rest of the configuration is the same as that of the first exemplary embodiment. In addition, this configuration may be combined with any of the configurations shown in FIGS. 2 to 6, as described in the first exemplary embodiment.

In the interconnect structure 21, the metal frame 11, the circuit of the semiconductor chip 14 and the external terminal 20 are electrically connected to one another through the vias 19 and 19b and the interconnect layers provided within the insulating layer 18.

The via 19b for electrically connecting the metal frame 11 and the interconnect structure 21 can be formed, for example, in the following manner. That is, an electrical conductor is provided in a desired position and in a desired shape on the metal frame 11 by carrying out a plating method, an etching method, a mechanical processing method, a printing method, a method of forming stud bumps with a bonding wire, a method of transferring a paste material, or the like. After that, an insulating layer is provided and the electrical conductor is exposed by processing this insulating layer. Alternatively, the via can be formed by forming a via hole after forming the insulating layer, and then providing an electrical conductor within the via hole. If a photosensitive material is used for the insulating layer at that time, the via can be formed by means of photolithography. If a nonphotosensitive material (or a photosensitive material having a low pattern resolution) is used for the insulating layer at that time, the via can be formed using a laser processing method, a dry etching method, or a blasting method. In addition to these methods, it is possible to employ the same configuration and formation method as those of the vias of the interconnect structure of the first exemplary embodiment.

According to the configuration of the present exemplary embodiment, it is possible to add electrical functions, such as a power supply and a ground, to the metal frame 11, in addition to the advantages of the first exemplary embodiment. Thus, it is possible to improve the electrical characteristics of the semiconductor device. Furthermore, since the areas of a power supply circuit, a ground circuit and the like provided in the interconnect structure 21 can be reduced, it is possible to decrease the number of interconnect layers of the interconnect structure 21. As a result, it is possible to achieve low costs and high yields.

Third Exemplary Embodiment

Figure 8A:
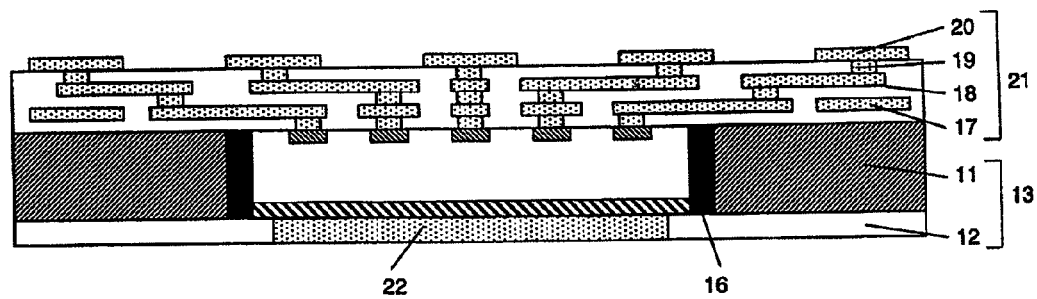
FIG. 8A is a schematic cross-sectional view illustrating one example of a third exemplary embodiment of a semiconductor device of the present invention.
Figure 8B:
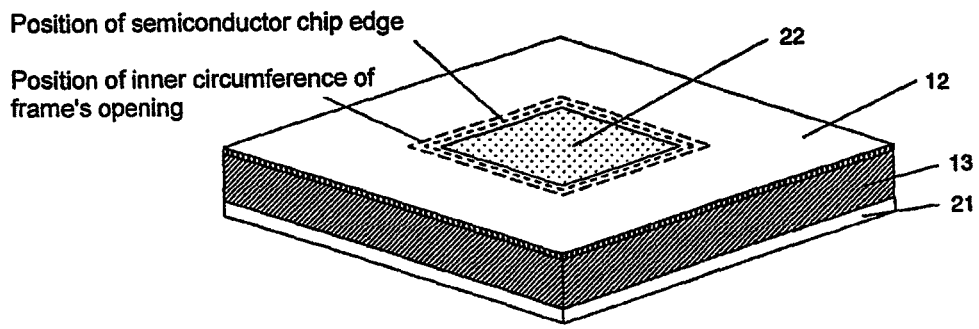
FIG. 8B is a schematic perspective view illustrating the example of the third exemplary embodiment of the semiconductor device of the present invention.
Figure 9A:
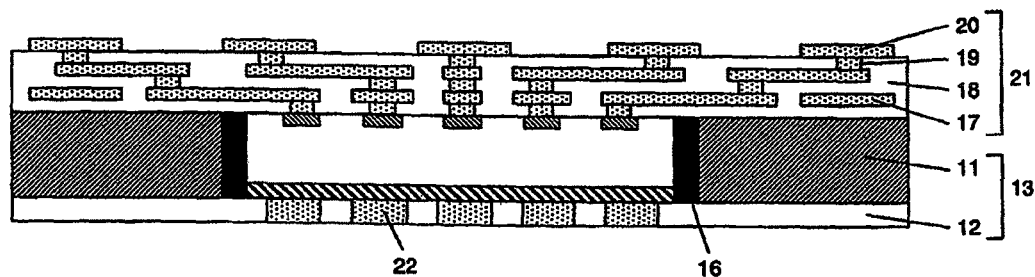
FIG. 9A is a schematic cross-sectional view illustrating another example of the third exemplary embodiment of the semiconductor device of the present invention.
Figure 9B:
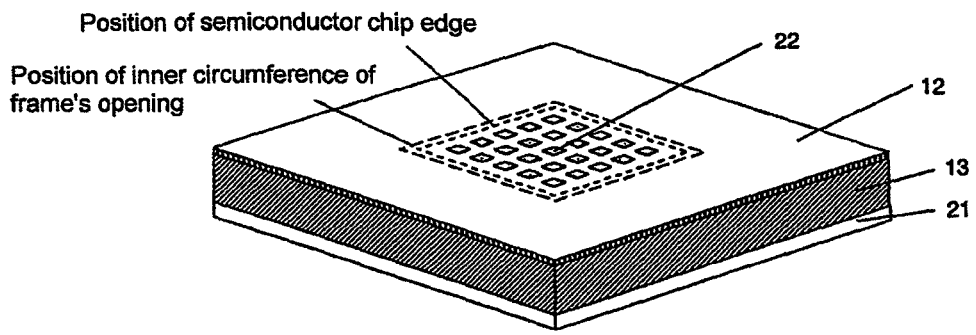
FIG. 9B is a schematic perspective view illustrating the example of the third exemplary embodiment of the semiconductor device of the present invention.
Figure 9C:
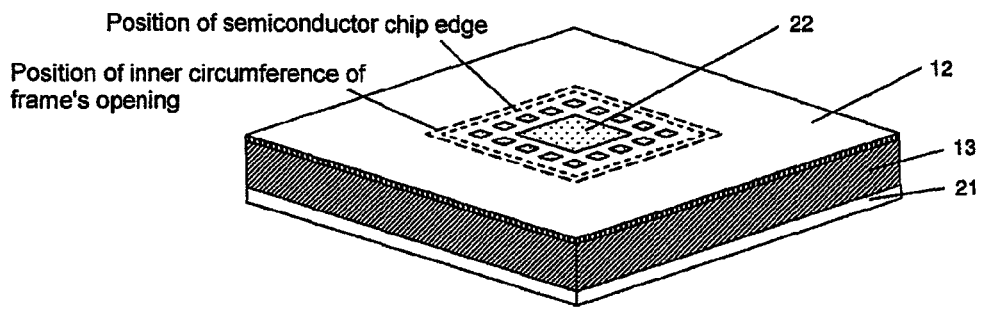
FIG. 9C is a schematic perspective view illustrating another example of the third exemplary embodiment of the semiconductor device of the present invention.

FIGS. 8A, 8B, 9A, 9B and 9C are schematic explanatory drawings illustrating another exemplary embodiment of a semiconductor device of the present invention. FIGS. 8A and 9A are cross-sectional views, whereas FIGS. 8B, 9B and 9C are perspective views taken from the lower-surface side of the semiconductor device. The present exemplary embodiment differs from the first exemplary embodiment in that a penetrating metal pattern 22 is provided in an organic resin layer 12. For the rest of the present exemplary embodiment, it is possible to apply the same configuration as those of the first and second exemplary embodiments. In addition, this configuration may be combined with any of the configurations shown in FIGS. 2 to 6, as described in the first exemplary embodiment.

In FIGS. 8A and 8B, there is provided a metal pattern 22 composed of a single square or rectangular pattern. In FIGS. 9A, 9B and 9C, there is provided a metal pattern 22 composed of a plurality of square or rectangular patterns.

The metal pattern 22 is provided in a state in which at least part thereof penetrates the organic resin layer 12 in the film thickness direction thereof. Thus, the semiconductor device has a structure in which the metal pattern 22 is exposed at both surfaces of the organic resin layer 12. This metal pattern 22 is capable of improving the heat radiation performance of the semiconductor chip 14.

Examples of a metal for making up the metal pattern include copper, nickel, aluminum, gold, silver, palladium, platinum, iron, stainless steel, zinc, magnesium, titanium, 42-alloy, chromium, vanadium, rhodium, molybdenum, and cobalt. One metal alone or a plurality of materials selected from these metals may be used, and the metal pattern may have a single-layer structure or a laminated structure composed of a plurality of metals, as necessary. Copper or a copper alloy, among these metals, is preferred from the viewpoint of costs, processability, and the like. If there is a concern about metal contamination that may cause a performance degradation in semiconductor elements, the metal pattern can be formed of a material having barrier properties, such as nickel. Alternatively, the surface of the metal pattern 22 exposed to the semiconductor chip may be covered with a material having barrier properties.

This metal pattern 22 can be formed by first forming a metal pattern of a desired shape in a desired position on the lower surface of a metal plate before being machined into the metal frame 11, and then providing an organic resin layer 12 and processing this organic resin layer to expose the metal pattern. Alternatively, the metal pattern can be formed by forming an opening pattern after forming an organic resin layer 18, and then providing an electrical conductor within the opening pattern.

In accordance with heat radiation performance requirements, the metal pattern may be formed into a single pattern having a shape adapted to the installation area of the semiconductor chip 14, as shown in FIGS. 8A and 8B. Alternatively, the metal pattern may be formed into a pattern composed of a combination of a plurality of pattern portions, as shown in FIGS. 9B and 9C.

From the viewpoint of preventing defects at the time of manufacture, such as the partial lack of the metal pattern, the semiconductor device may have a structure in which part of the metal pattern is covered with the organic resin layer 12. In addition, a stopper made of metal or organic resin may be provided, so that at least part of a boundary between the organic resin layer 12 and the metal pattern 22 is covered with the stopper.

In the present example, a 10 μm-thick metal pattern 22 made of nickel was formed and covered with a polyimide resin used as the organic resin layer 22, and then the metal pattern 22 was exposed using a buffing method.

In order to further enhance heat radiation performance, a radiator plate or a heat sink may be provided so as to have contact with the metal pattern 22.

If an adhesion layer 15 is provided between the semiconductor chip 14 and the organic resin layer 12, there may be used a material improved in heat radiation performance by adding a filler made of a metal material or an inorganic material to an organic material, such as the epoxy-, polyimide-, acrylic-, urethane-, or epoxy acrylate-based material, in addition to the earlier-mentioned organic materials, such as epoxy-, polyimide-, acrylic-, urethane-, and epoxy acrylate-based materials, and a material containing silver paste or a solder material as major component.

According to the structure of the present exemplary embodiment, it is possible to improve the heat radiation performance of the semiconductor device, thereby stabilizing the operation of elements, in addition to the advantages of the first exemplary embodiment and/or the advantages of the second exemplary embodiment. Furthermore, since the installation area of the semiconductor chip is not entirely covered with an organic resin layer, it is possible to reduce a stress due to the contraction of the organic resin layer, thereby improving the reliability of elements.

Fourth Exemplary Embodiment

Figure 10A:
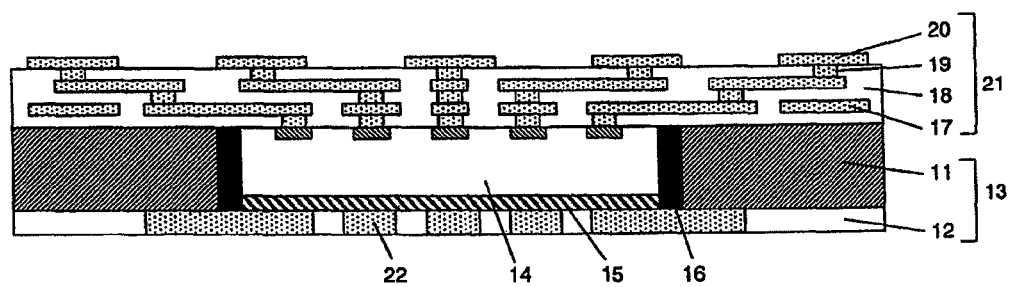
FIG. 10A is a schematic cross-sectional view illustrating one example of a fourth exemplary embodiment of a semiconductor device of the present invention.
Figure 10B:
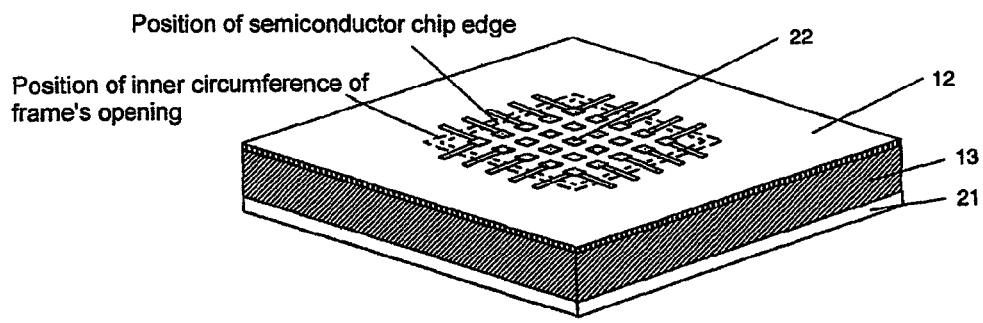
FIG. 10B is a schematic perspective view illustrating the example of the fourth exemplary embodiment of the semiconductor device of the present invention.

FIGS. 10A to 10E are schematic explanatory drawings illustrating another exemplary embodiment of a semiconductor device of the present invention. FIG. 10A is a cross-sectional view, whereas FIGS. 10B to 1010E are perspective views taken from the lower-surface side of the semiconductor device. The present exemplary embodiment differs from the third exemplary embodiment in the shape and layout of the metal pattern 22. For the rest of the present exemplary embodiment, it is possible to apply the same configuration as that of the third exemplary embodiment.

In the above-described third exemplary embodiment, the metal pattern is provided only within the installation area of the semiconductor chip. In contrast, in the present exemplary embodiment, the metal pattern is provided so as to range from the installation area of the semiconductor chip to the metal frame. According to this structure, it is possible to effectively release heat from the semiconductor chip to the metal frame, thereby further improving heat radiation performance.

Figure 10C:
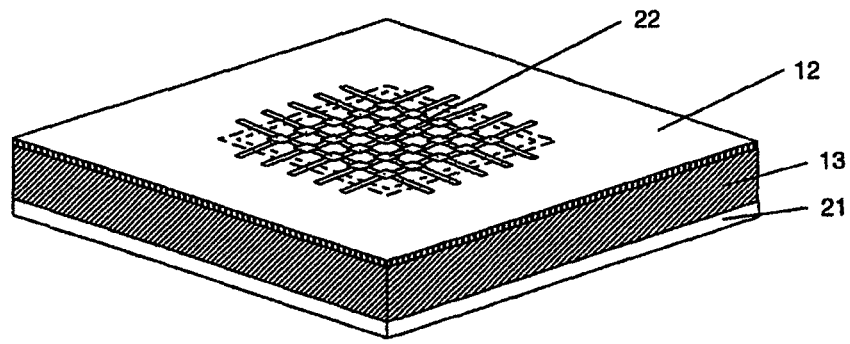
FIG. 10C is a schematic perspective view illustrating another example of the fourth exemplary embodiment of the semiconductor device of the present invention.

In FIGS. 10A to 10C, there is provided a plurality of small polygonal (rectangular, square, or the like) patterns or a plurality of small circular patterns provided within the installation area of the semiconductor chip, and a plurality of linear patterns connected to these small patterns and extending onto the metal frame. In these figures, a plurality of small patterns is arranged in a matrix-like manner, and the linear patterns are connected to small patterns in the outermost circumference. In FIG. 10C in particular, adjacent small patterns are connected to one another, thus forming heat radiation paths leading from inner small patterns through outer small patterns to the metal frame and thereby enhancing the effect of heat radiation.

Figure 10D:
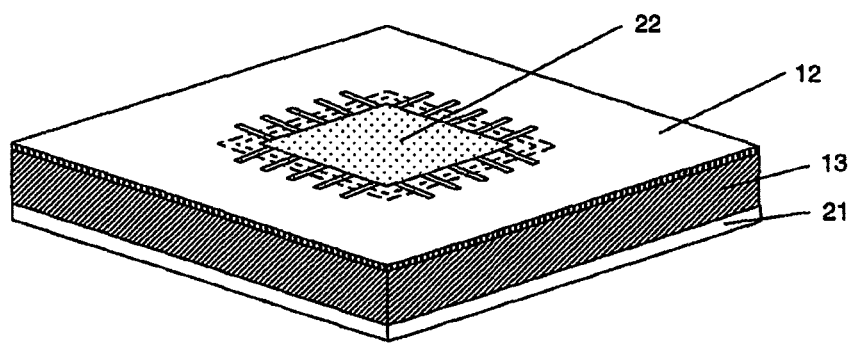
FIG. 10D is a schematic perspective view illustrating yet another example of the fourth exemplary embodiment of the semiconductor device of the present invention.

In FIG. 10D, there are provided, within the installation area of the semiconductor chip, a single pattern portion having a shape adapted to the installation area of the semiconductor chip, and a plurality of linear patterns connected to this pattern portion and extending onto the metal frame.

Figure 10E:
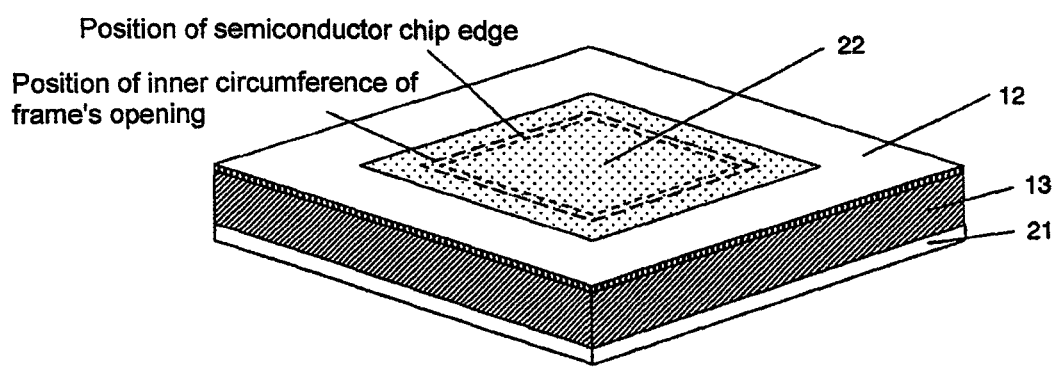
FIG. 10E is a schematic perspective view illustrating still another example of the fourth exemplary embodiment of the semiconductor device of the present invention.

In FIG. 10E, there is provided a single pattern so as to cover the entire installation area of the semiconductor chip and a portion of the metal frame in the periphery of the semiconductor chip's installation area.

In the metal patterns shown in FIGS. 10A to 10D, a heat radiation path from the semiconductor chip to the metal frame is composed of a linear pattern. In addition, a boundary between the outer circumference of the semiconductor chip and the inner circumference of the opening of the metal frame is not entirely covered with the metal pattern. Thus, it is possible to reduce a stress arising around this boundary.

The metal pattern shown in FIG. 10E has a large area of a heat radiation path from the semiconductor chip to the metal frame. Consequently, it is possible to obtain an even greater effect of heat radiation.

Fifth Exemplary Embodiment

In the present exemplary embodiment, it is possible to apply the same configuration as those of the first to fourth exemplary embodiments, except that the semiconductor device includes, in an interconnect structure 21, a first via to be connected to the upper surface of the semiconductor chip, a second via to be connected to the upper surface of the metal frame, and an electrical conductor layer to be connected to these vias.

The first via can be formed in the same way as the via to be connected to the terminal of the semiconductor chip explained in the first exemplary embodiment. Likewise, the second via can be formed in the same way as the via to be connected to the metal frame explained in the second exemplary embodiment. In addition, the electrical conductor layer to be connected to the first and second vias can be formed in the same way as the interconnect layer.

According to the structure of the present exemplary embodiment, it is possible to improve the heat radiation performance of the semiconductor device since there is formed a heat radiation path composed of the first via, the electrical conductor layer and the second via.

In each of the exemplary embodiments described heretofore, a capacitor serving as a circuit noise filter may be provided in a desired position of the metal frame 11 or the interconnect structure 21. Examples of a dielectric material for composing the capacitor include a metal oxide, such as a titanium oxide, a tantalum oxide, $Al_2O_3$, $SiO_2$, $ZrO_2$, $HfO_2$ or $Nb_2O_5$, a perovskite-based material ($0 \leq x \leq 1$, $0 < y < 1$), such as BST ($Ba_xSr_{1-x}TiO_3$), PZT ($PbZr_xTi_{1-x}O_3$) or PLZT ($Pb_{1-y}La_yZr_xTi_{1-x}O_3$) and a Bi-based layer-like compound, such as $SrBi_2Ta_2O_9$. Alternatively, a material made by mixing any of these inorganic materials or magnetic materials with an organic material may be used. In addition, a single insulating layer 18 or a plurality thereof may be formed using a material having a dielectric constant of 9 or greater and an opposing electrode may be formed in a position opposite to the metal frame 11, the interconnect layer 17, or the external terminal 20, thereby providing a capacitor to serve as a circuit noise filter. As a dielectric material for composing such a capacitor, it is possible to use one of the above-described dielectric materials.

Example of Manufacture 1

FIGS. 11(a) to 11(f) show cross-sectional process drawings for explaining a method for manufacturing the semiconductor device illustrated in FIG. 1.

First, as shown in FIG. 11(a), a metal plate 23 to serve as a metal frame 11 is prepared and the surface thereof is subjected to a treatment, such as wet cleaning, dry cleaning, planarization or roughening, as necessary. As a material for the metal plate 23, it is possible to use one of the above-described metal materials for a metal frame. In the present example, a 125 μm-thick copper plate was used as this metal plate.

Next, as shown in FIG. 11(b), an organic resin layer 12 is formed on one surface of the metal plate 23. As a material for the organic resin layer 12, it is possible to use one of the above-described organic materials. If a liquid organic material is used, the organic resin layer can be formed using a spin coating method, a die coating method, a curtain coating method, an alpha coating method, a printing method, or the like. If a dry film, a resin-coated copper foil, a prepreg, or the like is used as the organic material, the organic resin layer can be formed using a laminating method, a pressing method, a laminating method under a vacuum atmosphere, a pressing method under a vacuum atmosphere, or the like. If a thermosetting material or a solvent-containing material is used, a heat treatment for hardening and drying is performed in the process of forming a resin layer or after the process. In the present example, an organic resin layer made of a 10 μm-thick polyimide resin was formed.

Next, as shown in FIG. 11(c), an opening is provided in the metal plate 23 to form a metal frame 11. The opening can be formed using a wet etching method, a dry etching method, a mechanical processing method, a laser processing method, or a combination thereof. In a wet etching method or a dry etching method, an etching mask (not illustrated) having an opening pattern adapted to the opening to be formed is used to selectively etch an open portion of the metal plate not covered by the mask. After the completion of etching, the etching mask may be removed or may be left over. When the etching mask needs to be removed, the etching mask is removed using an etching liquid without etching the metal frame 11 and the organic resin layer 12. If it is difficult to remove the etching mask by etching, the etching mask may be removed by means of polishing.

If there is a concern about metal contamination that may cause a performance degradation in the semiconductor chip 14, it is possible to use a material having barrier properties, such as nickel, as a material for the metal frame. Alternatively, the surface of the metal frame 11 can be coated with a barrier material after forming the opening. Examples of a method for forming coatings include an electrolytic plating method, a nonelectrolytic plating method, a sputtering method, a sol-gel method, a vapor deposition method, and a CVD (Chemical Vapor Deposition) method.

In the present example, the metal frame 11 was formed by wet-etching the metal plate 23 using an epoxy-based resist material as the etching mask, and then removing the etching mask.

Note that treatments in respective steps, from a step of forming the opening to a step of mounting the semiconductor chip, are preferably carried out with the metal frame fixed to a support base or a supporting member, so that no damage is caused to the bottom of the opening.

Figure 11:
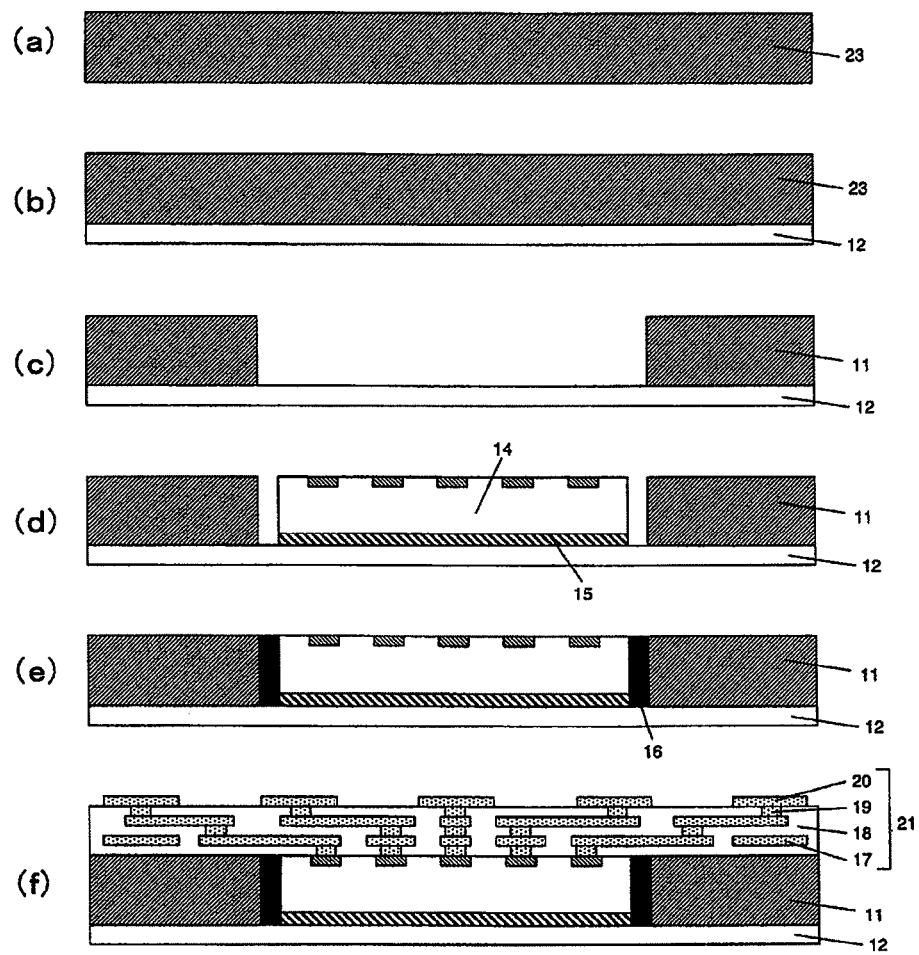
FIG. 11 is a cross-sectional process drawing illustrating one example of a method for manufacturing a semiconductor device of the present invention.

Next, as shown in FIG. 11(d), the semiconductor chip 14 is bonded onto the organic resin layer 12 within the opening of the metal frame 11 with intervention of the adhesion layer 15. If alignment marks are necessary when mounting the semiconductor chip 14, the alignment marks can be formed in one or both of the metal frame 11 and the organic resin layer 12 using an etching method, a printing method, a plating method, a laser processing method, a blasting method, a mechanical processing method, a sputtering method, a vapor deposition method, or a combination thereof. In FIG. 11, the circuit-formed surface of the semiconductor chip 14 and the surface of the metal frame 11 are almost level with each other. Alternatively, by selecting the thicknesses of the semiconductor chip 14 and the adhesion layer 15 as appropriate, it is possible to form a structure in which the circuit-formed surface of the semiconductor chip 14 protrudes above the surface of the metal frame 11 (FIG. 2) or a structure in which the circuit-formed surface of the semiconductor chip 14 is recessed below the surface of the metal frame 11 (FIG. 3).

The adhesion layer 15 is formed in order to bond the semiconductor chip 14 and the organic resin layer 12 to each other. The adhesion layer 15 may be formed on a surface (lower surface) of the semiconductor chip 14 opposite to the circuit-formed surface thereof or within the opening of the base material 13, before the semiconductor chip 14 is mounted. When forming the adhesion layer 15 on the semiconductor chip 14, it is possible to use a method in which an adhesive agent layer is formed on a wafer level on the lower surface, and then the wafer is diced into individual chips. When forming the adhesion layer 15 within the opening of the base material 13, it is possible to provide a viscous paste-like or sheet-like material. As a material for the adhesion layer 15, it is possible to use an organic material, such as an epoxy-based, polyimide-based, acrylic-based, urethane-based, or epoxy acrylic-based material, or a material containing primarily of silver paste or a solder material as a major component. The semiconductor chip 14 and the organic resin layer 12 can be bonded together using the adhesion layer 15 by means of pressurization, heat treatment, or a combination thereof. In addition, wet cleaning or dry cleaning may be performed, as necessary.

If the organic resin layer 12 itself has bonding capability, the semiconductor chip 14 may be directly bonded onto the organic resin layer 12, as shown in FIG. 4. In order for the organic resin layer itself to have bonding capability, it is possible to use an organic material having thermoplasticity or an organic resin in a state of having not yet undergone hardening reaction as the material of the organic resin layer. Bonding can be carried out by providing the semiconductor chip on such an organic resin layer as described above, and then performing pressurization, heat treatment, or a combination thereof. In addition, wet cleaning or dry cleaning may be performed, as necessary.

In the present example, a 110 μm-thick semiconductor chip 14 was used and a 15 μm-thick adhesion layer 15 made of a polyimide-based material was formed.

Next, as shown in FIG. 11(e), an insulating material is filled in a gap between a side surface within the opening of the metal frame 11 and a side surface of the semiconductor chip 14, to form a filling layer 15. This gap is formed in order to avoid tool interference when mounting the semiconductor chip 14 within the opening of the metal frame 11. The insulating material can be filled using a method of injecting a viscous insulating material from a nozzle, an ink-jet method, a printing method, a transfer method, a potting method, or the like. As the insulating material, it is possible to use an organic material, such as an epoxy-, polyimide-, acrylic-, urethane-, or epoxy acrylate-based resin, or a material made by adding an inorganic filler, as typified by silica, alumina, titanium oxide and the like, to any of these organic materials.

In FIG. 11, the upper surface of the filling layer 16 is level with the upper surface of the semiconductor chip 14. Alternatively, the upper surface of the filling layer may protrude above the upper surface of the semiconductor chip 14, as shown in FIG. 6, or may be recessed below the upper surface of the semiconductor element 14, as shown in FIG. 5.

In the present example, a filling layer, the upper surface of which was located approximately 3 μm lower than the upper surface of the semiconductor chip, was formed using a filler-free epoxy-based organic material as the insulating material.

Next, an interconnect structure 21 is formed as shown in FIG. 11(f). The interconnect structure 21 is composed of an insulating layer 18, an interconnect layer 17 provided with intervention of the insulating layer, vias 1 and 19, and an external terminal 20 provided on the uppermost surface of the interconnect structure, where the interconnect layer 17 and the insulating layer 18 are laminated alternately. Either the interconnect layer 17 or the insulating layer 18 may be formed first, as necessary, on the exposed surface of the semiconductor chip 14. When providing the interconnect structure 21, a pattern for alignment may be previously formed on the semiconductor chip 14 to perform alignment with the interconnect structure. If the accuracy of alignment between the semiconductor chip 14 and the metal frame 11 is satisfactory, the pattern for alignment may be formed in the metal frame 11. These patterns for alignment can be formed using an etching method, a printing method, a plating method, a laser processing method, a blasting method, a mechanical processing method, a sputtering method, a vapor deposition method, or a combination thereof.

Examples of a material for the interconnect layer 17 include a conductive material, such as copper, gold, nickel, aluminum, silver, and palladium. One material alone or a plurality of materials selected from these materials can be used in combination. From the viewpoint of resistance values and costs, copper or a copper alloy is preferred. In addition, nickel is capable of preventing an interfacial reaction of other materials, such as an insulating material, with an interconnect material. Nickel can also be used as a resistive interconnect or an inductor by taking advantage of the characteristics thereof as a magnetic substance. In the present example, a 10 μm-thick copper interconnect was formed using a later-described semi-additive method (power supply layer was formed using a sputtering method).

As a method for forming the interconnect layer 17, it is possible to use a subtractive method, a semi-additive method, a full-additive method, or the like. The subtractive method is a method in which a resist having a predetermined pattern is formed on a copper foil provided on a substrate, and the resist is removed after etching away an unnecessary copper foil using this resist as a mask, thereby forming a predetermined interconnect pattern. The semi-additive method is a method in which a resist having a predetermined pattern is formed after forming a power supply layer using a nonelectrolytic plating method, a sputtering method, a CVD (Chemical Vapor Deposition) method, or the like, metal is precipitated on part of the power supply layer not covered with this resist using an electrolytic plating method, and the resist and the power supply layer thereunder are removed, thereby obtaining a predetermined interconnect pattern. The full-additive method is a method in which a resist pattern is formed after adsorbing a nonelectrolytic plating catalyst onto a substrate, the catalyst is activated using this resist as a mask, metal is precipitated in a region not covered with this resist using a nonelectrolytic plating method, and the resist is removed, thereby obtaining a predetermined interconnect pattern. As another method, a concave portion having a pattern corresponding to a predetermined interconnect pattern is provided in the insulating layer and, after forming a power supply layer using a nonelectrolytic plating method, a sputtering method, a CVD method, or the like, a metal film is formed so as to cover the concave portion using a nonelectrolytic plating method or an electrolytic plating method, and the surface of the metal film is polished to remove metal outside the concave portion. Thus, it is possible to obtain an interconnect layer buried in the concave portion.

The insulating layer 18 can be formed in the usual manner using the same material as the organic material of the above-described organic resin layer 12. In particular, a polyimide resin, PBO, or a material made by impregnating a woven fabric or an unwoven fabric with a resin is preferred since these materials are superior in mechanical characteristics, such as film strength, a modulus of elongation and a percentage of elongation at break and, therefore, high reliability can be attained. In the present example, a 10 μm-thick insulating layer made of a polyimide resin was formed between the metal frame and the interconnect layer, between the semiconductor chip and the interconnect layer, between the lower-layer side interconnect layer and the upper-layer side interconnect layer, and between the interconnect layer and the external terminal.

The vias 19 and 19a can be formed by forming via holes in the insulating layer 18 and then filling a conductive material in the via holes. That is, the vias can be formed by using an electrolytic plating method, a nonelectrolytic plating method, an inkjet method, a printing method, or the like so as to fill the conductive material in the via holes. Alternatively, the vias can be formed by forming the conductive material along the inner wall surfaces of the via holes. The vias may be formed concurrently with the formation of the interconnect layer 17, or may be formed separately. As a conductive material for the via 19, it is possible to use copper, gold, silver, tin, nickel, a solder material, or an alloy thereof. Prior to forming the conductive material within the via holes, cleaning may be performed using a wet etching method, a dry etching method, or a combination thereof, in order to remove a residue in the bottoms of the via holes. If a photosensitive material is used for the insulating layer, the vias can be formed by means of photolithography. If a nonphotosensitive material (or a photosensitive material having a low pattern resolution) is used, the via holes can be formed using a laser processing method, a dry etching method or a blasting method. As another method of via formation, a plated post is previously formed in a position where a via is to be formed, and then an insulating film is formed. Then, the surface of the insulating film is ground by means of polishing so as to expose the plated post. The via can thus be obtained. According to this plated post method, there is no need to previously form a via hole in the insulating layer. When forming a via for connecting the metal frame 11 and the interconnect layer 17, the formation of this via and the formation of a via for connecting a terminal of the semiconductor chip 14 and the interconnect layer 17 may be performed in separate steps or may be performed in the same step. When forming a via for connecting the upper surface of the semiconductor chip and the interconnect layer (electrical conductor layer connected to the metal frame through the via) in order to form a heat radiation path, the formation of this via and the formation of a via for connecting a terminal of the semiconductor chip 14 and the interconnect layer 17 may be performed in separate steps or may be performed in the same step.

In the present example, vias made of copper were formed using a plated post method.

The external terminal 20 is provided on the uppermost surface of the interconnect structure, and is electrically connected to the semiconductor chip 14 through a via and an interconnect layer.

Although in FIG. 11, no solder resist is provided on the interconnect structure, a solder resist may be provided so that the semiconductor device has a structure in which at least part of the external terminal 20 is exposed. Examples of a material for the solder resist include epoxy-, acrylic-, urethane-, and polyimide-based organic materials. A filler made of an inorganic material or an organic material may be added to any of these materials as desired. If the material of the solder resist is in a liquid state, the material can be coated using a spin coating method, a die coating method, a curtain coating method, an alpha coating method, a printing method, or the like. If the material of the solder resist is in a film state, such as a dry film, the solder resist can be laminated using a laminating method, a pressing method, a laminating method under a vacuum atmosphere, a pressing method under a vacuum atmosphere, or the like. If a thermosetting material or a solvent-containing material is used, a heat treatment for hardening and drying is performed in the process of forming a solder resist or after the process. An opening of the solder resist can be formed using a photolithography method if a photosensitive organic material is used. If a nonphotosensitive organic material (or a photosensitive material having a low pattern resolution) is used, the opening can be formed using a laser processing method, a dry etching method or a blasting method. In addition, if the solder resist is provided, only the surface of the external terminal 20 within opening of the solder resist may be formed of at least one type of metal, or an alloy thereof, selected from the group consisting of gold, silver, copper, tin and a solder material. In addition, the semiconductor device may have a structure in which a solder resist pattern is formed, and then a pattern of the external terminal 20 is provided so as to cover the opening of the solder resist pattern.

An interconnect layer may be provided on the insulating layer on which the external terminal 20 is provided. This interconnect layer may be formed concurrently with the formation of the external terminal.

In the present example, a 10 μm-thick copper pattern was formed as the external terminal 20 using a semi-additive method with a sputtered film serving as a power supply layer. Next, a solder resist (not illustrated) was formed, and a 3 μm-thick film of nickel (not illustrated) and a 0.5 μm-thick film of gold (not illustrated) were laminated in order on a copper film only within the opening of the solder resist, so that the uppermost surface of the external terminal was formed of gold.

In the present example of manufacture, a case has been shown in which only one semiconductor device is formed. Alternatively, a plurality of semiconductor devices may be formed collectively, and the semiconductor devices may be cut and separated finally using a dicing method, a pressing method, a laser processing method, a water cutter method, or the like. In this case, it is preferable that under a condition in which a plurality of metal plates is combined, semiconductor devices provided with metal frames corresponding to the respective metal plates are fabricated, so that the metal frame 11 does not exist in cut areas, and then cut out at the boundaries of these combined metal plates, in order to suppress damage at the time of separation. The plurality of metal plates 23 may be formed into a large-sized plate by bringing the side surfaces thereof into contact with one another lengthwise and breadthwise. Alternatively, the metal plates may be combined into a single row or a plurality of rows, so as to be formed into a long reel. By carrying out manufacturing with a plurality of metal plates combined, it is possible to increase productivity.

Also in the present example of manufacture, one semiconductor chip is mounted on one semiconductor device. Alternatively, the semiconductor device can be configured so that a plurality of openings is provided in one metal plate and a semiconductor chip is provided in each opening.

Example of Manufacture 2

FIGS. 12(a) to 12(h) show cross-sectional process drawings for explaining a method for manufacturing the semiconductor device shown in FIGS. 8A and 8B. The present example of manufacture can be carried out in the same way as the example of manufacture 1, except the manufacturing process thereof related to the formation of a metal pattern 22. The manufacture of constituent elements common to the semiconductor device manufactured in the example of manufacture 1 can be carried out in the same way as the example of manufacture 1.

Figure 12:
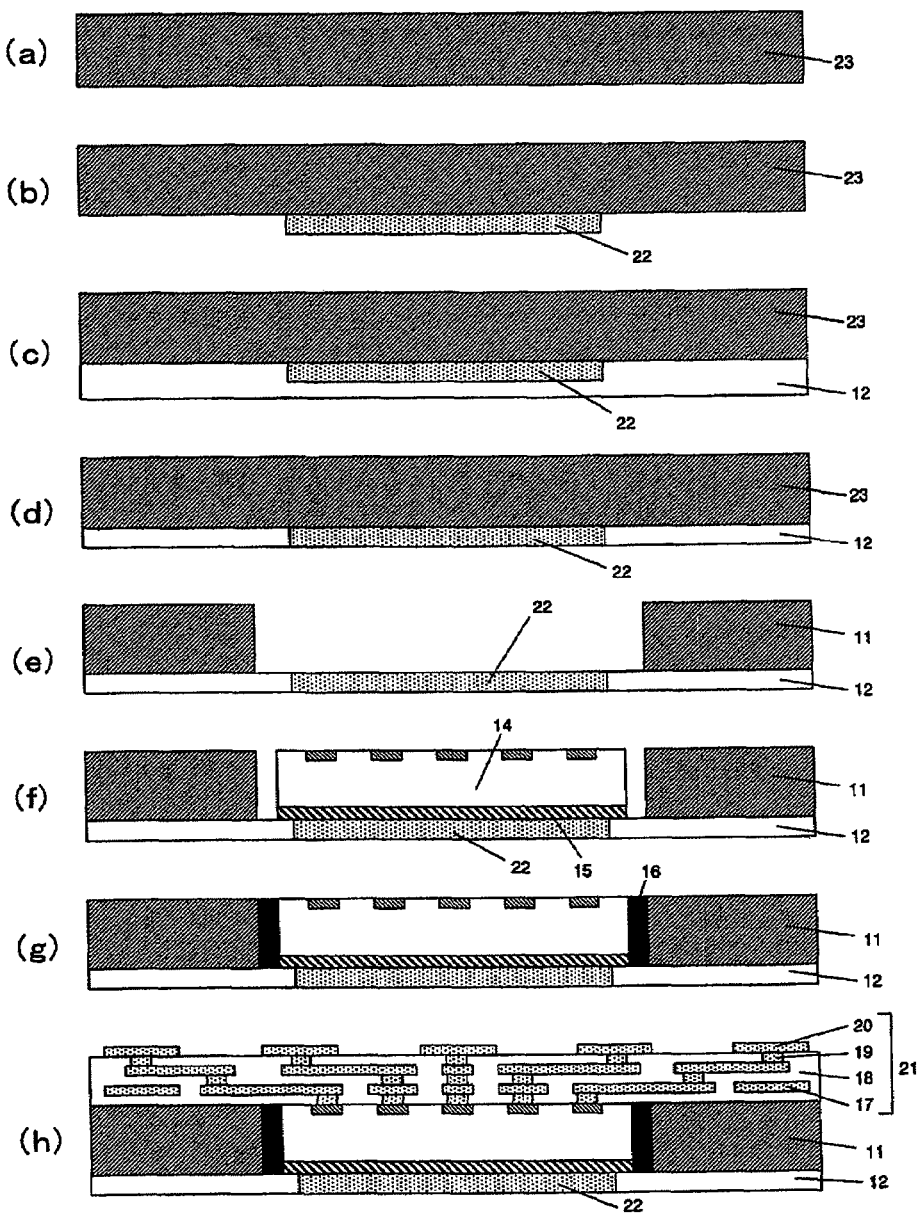
FIG. 12 is a cross-sectional process drawing illustrating another example of the method for manufacturing the semiconductor device of the present invention.

First, as shown in FIG. 12(a), a metal plate 23 to serve as a metal frame 11 is prepared. In the present example, a 125 µm-thick copper plate was used as this metal plate.

Next, as shown in FIG. 12(b), a metal pattern 22 having a predetermined shape is formed in a predetermined position on one surface of the metal plate 23.

As a first method for forming the metal pattern 22, the metal pattern can be formed by processing the metal plate 23 using a wet etching method, a dry etching method, a mechanical processing method, a laser processing method, or a combination thereof. In the wet etching and dry etching methods, the metal plate 23 is selectively etched using a mask having an opening pattern. The mask may be removed or may be left over after the completion of etching. When the mask needs to be removed, the mask is removed using an etching liquid whereby the metal plate 23 and the metal pattern 22 are not etched. The mask may be removed by means of polishing, instead of removal by etching.

As a second method for forming the metal pattern, the metal pattern can be formed using an electrolytic plating method, a nonelectrolytic plating method, a vapor deposition method, a sputtering method, a CVD (Chemical Vapor Deposition) method, a method of pressure-welding metals by heating and pressurization, a printing method, a method of forming stud bumps with a bonding wire, a method of transferring a paste material, or the like. The metal pattern can also be formed by forming an opening pattern after forming the organic resin layer 18, and then providing an electrical conductor in the opening pattern. If a photosensitive material is used for the organic resin layer in a process of forming the organic resin layer, the opening pattern can be formed by means of photolithography. If a nonphotosensitive material (or a photosensitive material having a low pattern resolution) is used, the opening pattern can be formed using a laser processing method, a dry etching method or a blasting method.

If there is a concern about a degradation in the performance of elements due to metallic contamination attributable to the metal pattern 22 exposed within an opening for mounting a semiconductor chip when the opening is formed in the metal plate 23, it is possible to form the metal pattern using a barrier material, such as nickel. Alternatively, the exposed surface of the metal pattern 22 may be coated with the barrier material. Coatings can be formed using an electrolytic plating method, a nonelectrolytic plating method, a sputtering method, a sol-gel method, a vapor deposition method, or a CVD (Chemical Vapor Deposition) method.

In the present example, a 10 µm-thick nickel pattern was formed as the metal pattern 22 by an electrolytic nickel plating method using a plating resist.

Next, as shown in FIG. 12(c), an organic resin layer 12 is formed on the surface of the metal plate 23, on which the metal pattern 22 has been formed, so as to cover the metal pattern 22. In the present example, an organic resin layer made of a 10 µm-thick polyimide resin was formed.

Next, as shown in FIG. 12(d), the metal pattern 22 is exposed out of the organic resin layer 12. In the present example, the organic resin layer 22 on the metal pattern was removed using a buffing method to expose the metal pattern 22.

As a method for exposing the metal pattern, it is possible to apply photolithography according to a portion of the organic resin layer 12 at which the metal pattern 22 needs to be exposed, if a photosensitive material is used for the organic resin layer 12. If the organic resin layer 12 is made of a nonphotosensitive material (or a photosensitive material having a low pattern resolution), the metal pattern can be exposed by removing the organic resin layer on the metal pattern using a laser processing method, a dry etching method, a polishing method, a cutting method, a mechanical processing method, a blasting method, or the like.

In the present exemplary embodiment shown in FIGS. 12(a) to 12(h), the metal pattern 22 is formed on the metal plate 23 before the organic resin layer 12 is formed. Alternatively, the organic resin layer 12 may be formed first and, after forming a predetermined opening pattern, a conductive material may be provided within an opening of the opening pattern, thereby forming the metal pattern 22. At that time, the opening pattern can be formed by means of photolithography if a photosensitive material is used for the organic resin layer. Alternatively, the opening pattern can be formed by a laser processing method, a dry etching method, a blasting method, or the like if a nonphotosensitive material (or a photosensitive material having a low pattern resolution) is used for the organic resin layer.

In the present exemplary embodiment shown in FIGS. 12(a) to 12(h), the metal pattern shown in FIGS. 8A and 8B is formed. In the same manner as this, it is possible to form the metal pattern 22 shown in FIGS. 9A to 9C and in FIGS. 10A to 10D.

Next, as shown in FIG. 12(e), an opening is provided in the metal plate 23 to form a metal frame 11. In the present example, the metal plate 23 was wet-etched using an epoxy-based resist material as an etching mask, and then the etching mask was removed, thereby forming the metal frame 11.

Note that treatments in respective steps, from a step of forming the opening to a step of mounting the semiconductor chip, are preferably carried out with the metal frame fixed to a support base or a supporting member, so that no damage is caused to the bottom of the opening.

Next, as shown in FIG. 12(f), the semiconductor chip 14 is bonded onto the organic resin layer 12 and the metal pattern 22 within the opening of the metal frame 11 with intervention of the adhesion layer 15. In the present example, a 110 µm-thick semiconductor chip 14 was used and a 15 µm-thick adhesion layer 15 made of a polyimide-based material was formed.

Next, as shown in FIG. 12(g), an insulating material is filled in a gap between a side surface within the opening of the metal frame 11 and a side surface of the semiconductor chip 14, to form a filling layer 15. In the present example, a filling layer, the upper surface of which was located approximately 3 µm lower than the upper surface of the semiconductor chip, was formed using a filler-free epoxy-based organic material as the insulating material.

Next, an interconnect structure 21 is formed as shown in FIG. 12(h). In the present example, a 10 µm-thick copper interconnect was formed using a semi-additive method (a power supply layer was formed using a sputtering method). Also in the present example, a 10 μm-thick insulating layer made of a polyimide resin was formed between the metal frame and the interconnect layer, between the semiconductor chip and the interconnect layer, between the lower-layer side interconnect layer and the upper-layer side interconnect layer, and between the interconnect layer and an external terminal. Further, in the present example, a via made of copper was formed using a plated post method. An external terminal 20 was formed in the following manner. First, a 10 μm-thick copper pattern was formed using a semi-additive method with a sputtered film serving as a power supply layer. Next, a solder resist (not illustrated) was formed, and a 3 μm-thick film of nickel (not illustrated) and a 0.5 μm-thick film of gold (not illustrated) were laminated in order on a copper film only within the opening of the solder resist, so that the uppermost surface of the external terminal was formed of gold.

Example of Manufacture 3

Figure 13:
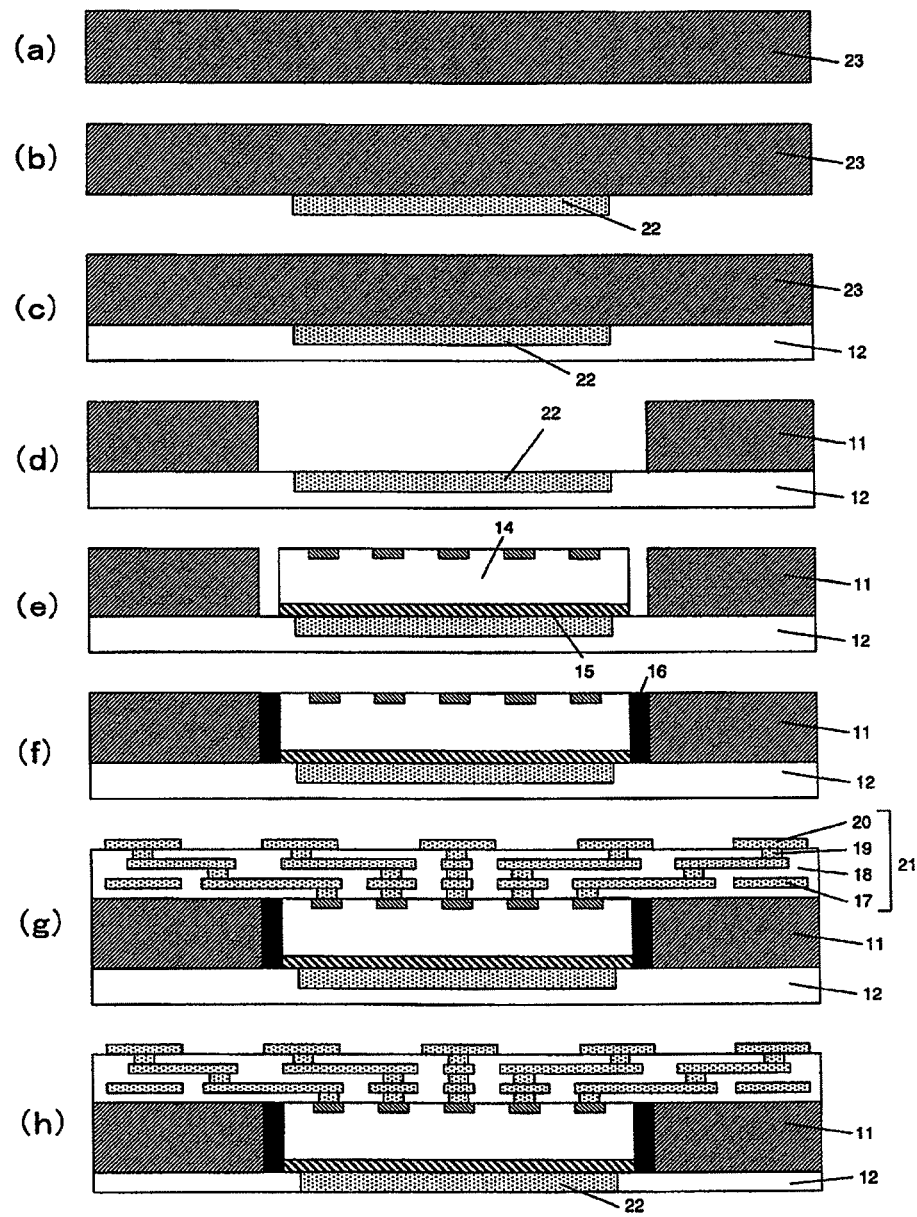
FIG. 13 is a cross-sectional process drawing illustrating yet another example of the method for manufacturing the semiconductor device of the present invention.

FIGS. 13(*a*) to 13(*h*) show cross-sectional process drawings for explaining a method for manufacturing the semiconductor device shown in FIGS. 8A and 8B. The manufacturing process of the example of manufacture 3 can be carried out in the same way as that of the example of manufacture 2, except that the order of steps for exposing the metal pattern 22 differs from that of the example of manufacture 2. In addition, the manufacture of constituent elements common to the semiconductor device manufactured in the example of manufacture 1 can be carried out in the same way as the example of manufacture 1.

First, as shown in FIG. 13(*a*), a metal plate 23 to serve as a metal frame 11 is prepared. In the present example, a 125 μm-thick copper plate was used as this metal plate.

Next, as shown in FIG. 13(*b*), a metal pattern 22 having a predetermined shape is formed in a predetermined position on one surface of the metal plate 23. In the present example, a 10 μm-thick nickel pattern was formed as the metal pattern 22 by an electrolytic nickel plating method using a plating resist.

Next, as shown in FIG. 13(*c*), an organic resin layer 12 is formed on the surface of the metal plate 23, on which the metal pattern 22 has been formed, so as to cover the metal pattern 22. In the present example, an organic resin layer made of a 10 μm-thick polyimide resin was formed.

Next, as shown in FIG. 13(*d*), an opening is provided in the metal plate 23 to form a metal frame 11. In the present example, the metal plate 23 was wet-etched using an epoxy-based resist material as an etching mask, and then the etching mask was removed, thereby forming the metal frame 11.

Next, as shown in FIG. 13(*e*), the semiconductor chip 14 is bonded onto the organic resin layer 12 and the metal pattern 22 within the opening of the metal frame 11 with intervention of the adhesion layer 15. In the present exemplary embodiment, a 110 μm-thick semiconductor chip 14 was used and a 15 μm-thick adhesion layer 15 made of a polyimide-based material was formed.

Next, as shown in FIG. 13(*f*), an insulating material is filled in a gap between a side surface within the opening of the metal frame 11 and a side surface of the semiconductor chip 14, to form a filling layer 15. In the present example, a filling layer, the upper surface of which was located approximately 3 μm lower than the upper surface of the semiconductor chip, was formed using a filler-free epoxy-based organic material as the insulating material.

Next, an interconnect structure 21 is formed as shown in FIG. 13(*g*). In the present exemplary embodiment, a 10 μm-thick copper interconnect was formed using a semi-additive method (a power supply layer was formed using a sputtering method). Also in the present example, a 10 μm-thick insulating layer made of a polyimide resin was formed between the metal frame and the interconnect layer, between the semiconductor chip and the interconnect layer, between the lower-layer side interconnect layer and the upper-layer side interconnect layer, and between the interconnect layer and an external terminal. Further, in the present example, a via made of copper was formed using a plated post method. An external terminal 20 was formed in the following manner. First, a 10 μm-thick copper pattern was formed using a semi-additive method with a sputtered film serving as a power supply layer. Next, a solder resist (not illustrated) was formed, and a 3 μm-thick film of nickel (not illustrated) and a 0.5 μm-thick film of gold (not illustrated) were laminated in order on a copper film only within the opening of the solder resist, so that the uppermost surface of the external terminal was formed of gold.

Next, as shown in FIG. 13(*h*), the metal pattern 22 is exposed out of the organic resin layer 12. In the present example, the organic resin layer 22 on the metal pattern was removed using a buffing method to expose the metal pattern 22. The present exemplary embodiment is not limited to this method but the various methods explained in the example of manufacture 2 can be carried out.

In the present exemplary embodiment, the metal pattern is protected by the organic resin layer in a process from a step of forming the metal pattern to a step of exposing the metal pattern, since the metal pattern is exposed in a final step. Thus, it is possible to prevent the metal pattern from suffering damage.

Example of Manufacture 4

Figure 14:
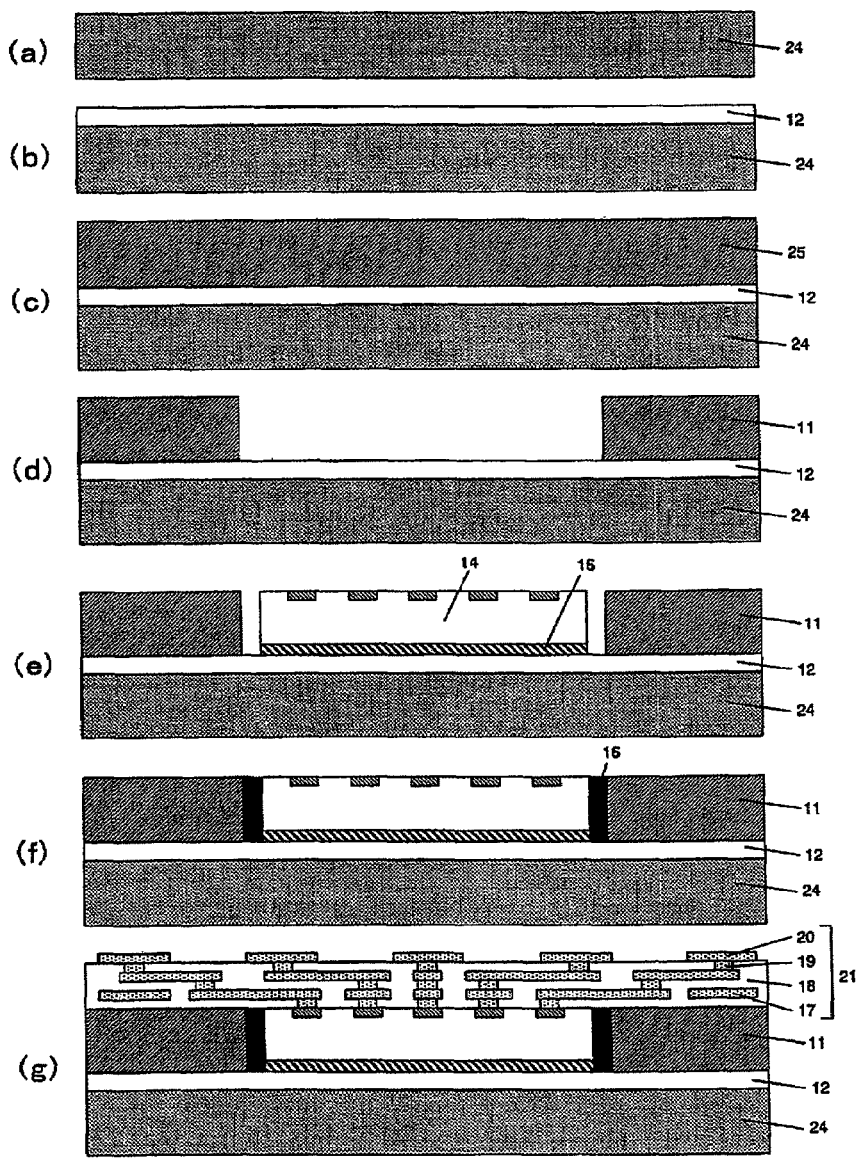
FIG. 14 is a cross-sectional process drawing illustrating still another example of the method for manufacturing the semiconductor device of the present invention.

FIGS. 14(*a*) to 14(*g*) show cross-sectional process drawings for explaining another example of a method for manufacturing the semiconductor device shown in FIG. 1. The present example of manufacture is characteristic in that a supporting substrate 24 is used. The present example of manufacture can be carried in the same way as the example of manufacture 1, except a manufacturing process related to the use of this supporting substrate. The manufacture of constituent elements common to the semiconductor device manufactured in the example of manufacture 1 can be carried out in the same way as the example of manufacture 1.

First, as shown in FIG. 14(*a*), a supporting substrate 24 is prepared and the surface thereof is subjected to a treatment, such as wet cleaning, dry cleaning, planarization or roughening, as necessary. As a material capable of ensuring sufficient rigidity for the supporting substrate 24, it is possible to use a semiconductor wafer material, such as silicon, sapphire or GaAs, or metal, quartz, glass, ceramics, a printed board, or the like. In the present example, a 0.725 mm-thick silicon wafer provided with a thermally-oxidized film was used as the supporting substrate 24.

Next, as shown in FIG. 14(*b*), an organic resin layer 12 is formed on one surface of the supporting substrate 24. The organic resin layer can be formed in the same way as in the example of manufacture 1, except that the organic resin layer is provided in the supporting substrate. In the present example, an organic resin layer made of a 10 μm-thick polyimide resin was formed.

When forming a metal pattern 22 in the present example of manufacture, it is possible to form the metal pattern 22 having a predetermined shape in a predetermined position on one surface of the supporting substrate 24, and then provide the organic resin layer. Alternatively, it is possible to provide the metal pattern after forming the organic resin layer 12.

The metal pattern 22 can be formed prior to forming the organic resin layer 12, using an electrolytic plating method, a nonelectrolytic plating method, a vapor deposition method, a sputtering method, a CVD method, a method of pressure-welding metals by heating and pressurization, a printing method, a method of forming stud bumps with a bonding wire, a method of transferring a paste material, or the like. If there is a concern about metal contamination attributable to the metal pattern 22 exposed within the opening of the metal frame 11, it is possible to form the metal pattern using a barrier material, such as nickel. Alternatively, the exposed surface of the metal pattern 22 may be coated with the barrier material. Coatings can be formed using an electrolytic plating method, a nonelectrolytic plating method, a sputtering method, a sol-gel method, a vapor deposition method, or a CVD method.

In a case where the metal pattern 22 is formed after the formation of the organic resin layer 12, the metal pattern 22 can be formed by means of photolithography, if a photosensitive material is used for the organic resin layer 12. If a nonphotosensitive material (or a photosensitive material having a low pattern resolution) is used, the metal pattern 22 can be formed by forming an opening pattern using a laser processing method, a dry etching method or a blasting method, and then providing a electrical conductor in the opening of the opening pattern.

Specifically, the metal pattern can be formed, for example, in the following manner. First, a power supply layer is formed on a surface of the supporting substrate 24 using a sputtering method. After that, a metal pattern 22 made of a 10 μm-thick nickel film is formed using an electrolytic plating method. Next, a 10 μm-thick polyimide resin layer is formed as the organic resin layer 12, so as to cover this metal pattern 22, and then CMP (Chemical Mechanical Polishing) is performed to expose the metal pattern 22.

Next, as shown in FIG. 14(c), a metal layer 25 to serve as the metal frame 11 is formed on the organic resin layer 12. As a method for forming the metal layer 25, it is possible to use an electrolytic plating method, a nonelectrolytic plating method, a sputtering method, a sol-gel method, a vapor deposition method, a CVD method, or a combination thereof. Alternatively, a plate-like metal layer 25 corresponding to the supporting substrate 24 may be prepared separately and bonded onto the organic resin layer 12. When bonding the plate-like metal layer, the metal layer may be directly bonded to the organic resin layer 12 on the condition that the organic resin layer 12 itself has adhesiveness, or the metal layer may be bonded using an adhesive agent. Prior to forming the metal layer 25, a treatment, such as wet cleaning, dry cleaning, planarization or roughening, may be performed as necessary on the surface of the organic resin layer 12.

Examples of a material for the metal layer 25 include copper, nickel, aluminum, gold, silver, palladium, platinum, iron, stainless steel, zinc, magnesium, titanium, 42-alloy, chromium, vanadium, rhodium, molybdenum, and cobalt. One metal alone or a plurality of materials selected from these metals may be used, and the metal layer may have a single-layer structure or a laminated structure composed of a plurality of metals, as necessary. Copper or a copper alloy, among these metals, is preferred from the viewpoint of costs, processability, and the like. In the present example, a 125 μm-thick metal layer made of copper was formed using an electrolytic plating method.

Next, as shown in FIG. 14(d), an opening is provided in the metal layer 25 to form a metal frame 11. In the present example, the metal layer was wet-etched using an epoxy-based resist material as an etching mask, and then the etching mask was removed, thereby forming the metal frame 11. In the present example of manufacture, a metal layer 25 having no openings was provided, and then this metal layer was processed to form the metal frame 11. Alternatively, a metal frame 11 having an opening may be formed using a plating resist in a step of forming the metal layer 25 (FIG. 14(c)).

Next, as shown in FIG. 14(e), the semiconductor chip 14 is bonded onto the organic resin layer 12 within the opening of the metal frame 11 with intervention of the adhesion layer 15. In the present example, a 110 μm-thick semiconductor chip 14 was used and a 15 μm-thick adhesion layer 15 made of a polyimide-based material was formed.

Next, as shown in FIG. 14(f), an insulating material is filled in a gap between a side surface within the opening of the metal frame 11 and a side surface of the semiconductor chip 14, to form a filling layer 15. In the present example, a filling layer, the upper surface of which was located approximately 3 μm lower than the upper surface of the semiconductor chip, was formed using a filler-free epoxy-based organic material as the insulating material.

Next, an interconnect structure 21 is formed as shown in FIG. 14(g). In the present example, a 10 μm-thick copper interconnect was formed using a semi-additive method (a power supply layer was formed using a sputtering method). Also in the present example, a 10 μm-thick insulating layer made of a polyimide resin was formed between the metal frame and the interconnect layer, between the semiconductor chip and interconnect layer, between the lower-layer side interconnect layer and the upper-layer side interconnect layer, and between the interconnect layer and an external terminal. Further, in the present example, a via made of copper was formed using a plated post method. An external terminal 20 was formed in the following manner. First, a 10 μm-thick copper pattern was formed using a semi-additive method with a sputtered film serving as a power supply layer. Next, a solder resist (not illustrated) was formed, and a 3 μm-thick film of nickel (not illustrated) and a 0.5 μm-thick film of gold (not illustrated) were laminated in order on a copper film only within the opening of the solder resist, so that the uppermost surface of the external terminal was formed of gold.

After the completion of the above-described steps, the supporting substrate 24 is removed. Examples of a method for removing the supporting substrate 24 include a separation method in which a supporting substrate provided with a separation layer is used and the supporting substrate is separated by taking advantage of the low degree of adhesion of the separation layer, a method in which a transparent substrate is used as the supporting substrate and a material in contact with the supporting substrate is transubstantiated by laser light or ultraviolet light to lower the degree of adhesion thereof, thereby separating the supporting substrate, a method of etching the supporting substrate, a method of polishing the supporting substrate, a method of separation using a cutting means such as a water cutter or a slicer, and a method using a combination thereof. In the present example, the supporting substrate was separated by taking advantage of the low degree of adhesion between a thermally-oxidized film of silicon and copper.

Figure 15:
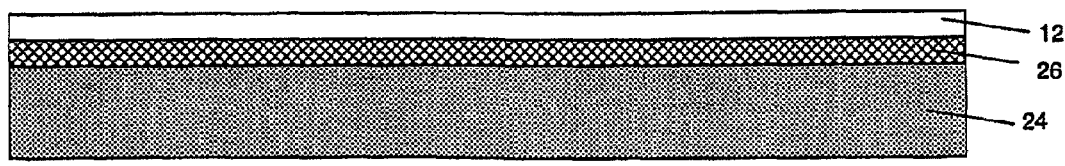
FIG. 15 is a cross-sectional process drawing illustrating still another example of the method for manufacturing the semiconductor device of the present invention.

As shown in FIG. 15, a separation layer 26 for using to separate the supporting substrate by taking advantage of the low degree of adhesion of the separation layer, can be formed between an organic resin layer and the supporting substrate 24. The separation layer may be provided on the supporting substrate 24, as in the present exemplary embodiment, or may be formed on the organic resin layer.

Although in the present example, the semiconductor device was formed on one surface of the supporting substrate 24, the semiconductor device may be formed on both sides of the supporting substrate 24.

While the invention has been particularly shown and described with reference to the exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority form Japanese patent application No. 2006-300681, filed on Nov. 6, 2006, the disclosure of which is incorporated herein in its entirety by reference.

The invention claimed is:

1. A semiconductor device comprising:
    a metal frame including a penetrating opening;
    a semiconductor chip provided within said opening;
    an insulating layer provided on the upper surface of said metal frame such that the insulating layer covers the upper surface of said semiconductor chip, the upper surface being a circuit-formed surface thereof;
    an interconnect layer provided only on the upper-surface side of said metal frame with intervention of the insulating material of said insulating layer, the interconnect layer being electrically connected to a circuit of said semiconductor chip;
    a heat-conducting path comprising
        a first electrical conductor provided within said insulating layer and having contact with the upper surface of said semiconductor chip;
        a second electrical conductor provided within said insulating layer and having contact with the upper surface of said metal frame; and
        an electrical conductor layer located on said insulating layer, the electrical conductor layer being electrically connected to said first electrical conductor and said second electrical conductor; and
    a resin layer provided on the lower surface of said metal frame.

2. The semiconductor device according to claim 1, further comprising a metal pattern made of a metal filling an opening penetrating said resin layer, wherein said metal pattern is provided at least in a region immediately underneath the lower surface of said semiconductor chip.

3. The semiconductor device according to claim 2, wherein said resin layer extends from the lower surface of said metal frame to a region immediately underneath the lower surface of said semiconductor chip, and said metal pattern is provided only in said region immediately underneath the lower surface of said semiconductor chip.

4. The semiconductor device according to claim 2, wherein said metal pattern has a pattern portion extending from said region immediately underneath the lower surface of said semiconductor chip onto the lower surface of said metal frame.

5. The semiconductor device according to claim 4, wherein said resin layer extends from the lower surface of said metal frame to said region immediately underneath the lower surface of said semiconductor chip, and said metal pattern includes a pattern portion provided within said region immediately underneath the lower surface of said semiconductor chip, and a linear pattern portion connected to said pattern portion and extending onto the lower surface of said metal frame.

6. The semiconductor device according to claim 4, wherein said metal pattern covers the whole of said region immediately underneath the lower surface of said semiconductor chip and a peripheral region surrounding said semiconductor chip in the lower surface of said metal frame.

7. The semiconductor device according to claim 1, wherein said resin layer is provided in a region immediately underneath the lower surface of said metal frame and the lower surface of said semiconductor chip, and the semiconductor device comprises an adhesion layer provided between said semiconductor chip and said resin layer to bond said semiconductor chip and said resin layer to each other.

8. The semiconductor device according to claim 1, comprising a filling layer made of an insulating material filled in a gap between a side surface of said semiconductor chip and a side surface within the opening of said metal frame.

9. The semiconductor device according to claim 8, wherein the upper surface of said filling layer, the upper surface of said semiconductor chip, and the upper surface of said metal frame are flush with one another.

10. The semiconductor device according to claim 8, wherein the upper surface of said filling layer protrudes above the upper surface of said semiconductor chip and the upper surface of said metal frame.

11. The semiconductor device according to claim 8, wherein the upper surface of said filling layer is recessed below the upper surface of said semiconductor chip and the upper surface of said metal frame.

12. The semiconductor device according to claim 1, wherein said electrical conductor layer used for said heat-conducting path is made of the same material as said interconnect layer.

13. The semiconductor device according to claim 1, further comprising an interconnect layer electrically connected to said metal frame.

14. The semiconductor device according to claim 13, wherein said metal frame is electrically connected to a power line or a ground line through said interconnect layer.

15. The semiconductor device according to claim 1, wherein the upper surface of said semiconductor chip and the upper surface of said metal frame are flush with each other.

16. The semiconductor device according to claim 1, wherein the upper surface of said semiconductor chip protrudes above the upper surface of said metal frame.

17. The semiconductor device according to claim 1, wherein the upper surface of said semiconductor chip is recessed below the upper surface of said metal frame.

18. The semiconductor device according to claim 1, comprising one or a plurality of interconnect structure layers including:
    an upper-layer side insulating layer provided on the upper-surface side of said insulating layer;
    a via conductor provided in said upper-layer side insulating layer; and
    an interconnect layer provided on the upper surface of said upper-layer side insulating layer and electrically connected to a lower interconnect layer through said via conductor; and
    wherein the semiconductor device further comprises:
        an uppermost insulating layer composing an uppermost layer;
        a via conductor provided in said uppermost insulating layer; and an external terminal provided on the upper surface of said uppermost insulating layer and electrically connected to a lower interconnect layer through said via conductor.

19. A method for manufacturing a semiconductor device as recited in claim 1, comprising:

forming a resin layer on one surface of a metal base material;

obtaining a metal frame by forming an opening in said metal base material from the other surface side thereof such that said resin layer is exposed;

mounting a semiconductor chip within said opening with the circuit-formed surface of said semiconductor chip facing up;

forming an insulating layer covering said metal frame and said semiconductor chip;

forming a via conductor connected to a conductive portion of the upper surface of said semiconductor chip; and forming an interconnect layer electrically connected to said via conductor.

20. A method for manufacturing a semiconductor device as recited in claim 2, comprising:

forming a metal pattern on one surface of a metal base material;

forming a resin layer covering said metal pattern;

obtaining a metal frame by forming an opening in said metal base material from the other surface side thereof such that said metal pattern remains;

mounting a semiconductor chip within said opening with the circuit-formed surface of said semiconductor chip facing up;

forming an insulating layer covering said metal frame and said semiconductor chip;

forming a via conductor connected to a conductive portion of the upper surface of said semiconductor chip;

forming an interconnect layer electrically connected to said via conductor; and removing said resin layer such that said metal pattern is exposed.

21. A method for manufacturing a semiconductor device as recited in claim 1, comprising:

bonding a supporting substrate and a metal base material to each other with intervention of a resin layer;

obtaining a metal frame by forming an opening in said metal base material such that said resin layer is exposed;

mounting a semiconductor chip within said opening with the circuit-formed surface of said semiconductor chip facing up;

forming an insulating layer so as to cover said metal frame and said semiconductor chip;

forming a via conductor to be connected to a conductive portion of the upper surface of said semiconductor chip;

forming an interconnect layer to be electrically connected to said via conductor; and separating said resin layer and said supporting substrate from each other.

22. A method for manufacturing a semiconductor device as recited in claim 1, comprising:

forming a resin layer and a metal frame including an opening on a supporting substrate;

mounting a semiconductor chip within said opening of said metal frame with the circuit-formed surface of said semiconductor chip facing up;

forming an insulating layer covering said metal frame and said semiconductor chip;

forming a via conductor connected to a conductive portion of the upper surface of said semiconductor chip;

forming an interconnect layer electrically connected to said via conductor; and separating said resin layer and said supporting substrate from each other.

23. The method for manufacturing a semiconductor device according to claim 21, comprising providing a separation layer on said supporting substrate or on said resin layer, so that said supporting substrate is bonded to said resin layer with intervention of said separation layer.

24. The method for manufacturing a semiconductor device according to claim 19, wherein said semiconductor chip is mounted with intervention of an adhesion layer in mounting said semiconductor chip.

25. The method for manufacturing a semiconductor device according to claim 19, comprising filling an insulating material in a gap between a side surface of said semiconductor chip mounted within said opening and a side surface within said opening of said metal frame.

\* \* \* \* \*

UNITED STATES PATENT AND TRADEMARK OFFICE
CERTIFICATE OF CORRECTION

PATENT NO. : 8,536,691 B2
APPLICATION NO. : 12/446899
DATED : September 17, 2013
INVENTOR(S) : Kikuchi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 910 days.

Signed and Sealed this
Fifteenth Day of September, 2015

Michelle K. Lee
*Director of the United States Patent and Trademark Office*